US012710606B2

(12) United States Patent
Rusu et al.

(10) Patent No.: US 12,710,606 B2
(45) Date of Patent: Aug. 18, 2026

(54) HETEROGENEOUS PACKAGING INTEGRATION OF PHOTONIC AND ELECTRONIC ELEMENTS

(71) Applicant: Taiwan Semiconductor Manufacturing Co., Ltd., Hsin-Chu (TW)

(72) Inventors: Stefan Rusu, Hsin-Chu (TW); Weiwei Song, Sunnyvale, CA (US); Mohammed Rabiul Islam, Austin, TX (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/619,037

(22) Filed: Mar. 27, 2024

(65) Prior Publication Data

US 2024/0241329 A1 Jul. 18, 2024

Related U.S. Application Data

(62) Division of application No. 17/191,477, filed on Mar. 3, 2021, now Pat. No. 11,966,090.

(51) Int. Cl.

| | |
|---|---|
| ***G02B 6/42*** | (2006.01) |
| ***H10W 40/22*** | (2026.01) |
| ***H10W 90/00*** | (2026.01) |
| *H10W 20/20* | (2026.01) |

(52) U.S. Cl.

CPC ........... *G02B 6/425* (2013.01); *G02B 6/4268* (2013.01); *H10W 40/22* (2026.01); *H10W 90/00* (2026.01); *H10W 20/20* (2026.01)

(58) Field of Classification Search

CPC ... G02B 6/425; G02B 6/4268; H01L 23/3675; H01L 23/481; H01L 25/0642; H01L 25/18; H01L 25/50

See application file for complete search history.

(56) References Cited

U.S. PATENT DOCUMENTS

| | | | | |
|---|---|---|---|---|
| 5,420,722 | A * | 5/1995 | Bielak | G02B 6/4204 359/708 |
| 6,095,697 | A * | 8/2000 | Lehman | G02B 6/423 385/91 |
| 6,450,699 | B1 | 9/2002 | Murali et al. | |
| 6,866,426 | B1 | 3/2005 | Steinberg et al. | |
| 6,985,506 | B2 | 1/2006 | Lissotschenko | |
| 7,062,144 | B2 | 6/2006 | Hwang et al. | |

(Continued)

OTHER PUBLICATIONS

Chidambaram et al., Wafer Level Fine-Pitch Hybrid Bonding: Challenges and Remedies, 2020 IEEE 22nd Electronics Packaging Technology Conference (EPTC), pp. 459-463 (Year: 2020).*

(Continued)

*Primary Examiner* — Peter Radkowski

(74) *Attorney, Agent, or Firm* — STUDEBAKER BRACKETT PLLC

(57) ABSTRACT

Heterogeneous packaging integration of photonic and electronic elements is described herein. In one embodiment, a disclosed package includes: a package substrate; a first layer comprising an electronic die on the package substrate; and a second layer comprising a photonic die. The second layer is bonded onto the first layer such that the photonic die is bonded onto the electronic die.

20 Claims, 29 Drawing Sheets

(56) References Cited

U.S. PATENT DOCUMENTS 7,239,767 B2 7/2007 Kim et al.
7,271,461 B2 9/2007 Dutta
7,373,033 B2 5/2008 Lu et al.
7,411,281 B2 8/2008 Zhang
7,595,227 B2 9/2009 Zhang
7,703,991 B2 4/2010 Lu et al.
7,847,411 B2 * 12/2010 Takaike .................. H01L 24/82 257/688
8,097,956 B2 * 1/2012 von Kaenel .......... H01L 25/105 257/777
8,111,730 B2 2/2012 Budd et al.
8,227,904 B2 7/2012 Braunisch et al.
8,470,613 B2 * 6/2013 von Kaenel .......... H01L 25/105 257/E21.531
8,498,504 B2 7/2013 Matsubara et al.
8,748,797 B1 6/2014 Decker et al.
8,829,656 B2 * 9/2014 Zhao ..................... H01L 23/147 257/E21.597
9,041,015 B2 5/2015 Lai et al.
9,190,379 B2 * 11/2015 Arnold .................... H01L 24/19
9,229,169 B2 1/2016 Doany et al.
9,236,355 B2 * 1/2016 Zhai ...................... H01L 23/552
9,263,511 B2 * 2/2016 Yu ........................... H10D 1/68
9,297,971 B2 * 3/2016 Thacker ............... G02B 6/4274
9,318,474 B2 * 4/2016 Zhai ........................ H01L 25/50
9,367,094 B2 * 6/2016 Bibl ...................... H01L 25/167
9,372,206 B2 * 6/2016 Wu .................... G01R 31/2896
9,461,018 B1 * 10/2016 Tsai .................... H01L 23/3128
9,496,189 B2 * 11/2016 Yu ........................... H01L 22/20
9,548,288 B1 * 1/2017 Ramachandran ....... H01L 25/16
9,559,081 B1 * 1/2017 Lai ...................... H01L 25/0657
9,570,883 B2 * 2/2017 Zarbock ............... G02B 6/4214
9,582,036 B2 * 2/2017 Bibl ...................... H01L 25/167
9,583,462 B2 * 2/2017 Lee ..................... H01L 23/5389
9,583,472 B2 * 2/2017 Chung ................ H01L 23/5389
9,589,936 B2 * 3/2017 Zhai ...................... H01L 21/561
9,601,471 B2 * 3/2017 Zhai ...................... H01L 25/105
9,633,974 B2 * 4/2017 Zhai ...................... H01L 21/568
9,659,907 B2 * 5/2017 Zhai ...................... H01L 21/561
9,679,801 B2 * 6/2017 Lai .......................... H01L 25/50
9,691,701 B2 * 6/2017 Zhai ......................... H10D 1/20
9,721,903 B2 * 8/2017 Lee ....................... H01L 23/552
9,735,131 B2 * 8/2017 Su ......................... H01L 25/105
9,768,145 B2 * 9/2017 Yu ...................... H01L 25/0652
9,786,641 B2 * 10/2017 Budd .................... H01L 25/167
9,829,626 B2 11/2017 Shubin et al.
9,847,284 B2 * 12/2017 Zhai ...................... H01L 23/498
9,875,911 B2 * 1/2018 Pagaila ................. H01L 21/568
9,922,966 B2 * 3/2018 Bibl ...................... H01L 25/167
9,935,087 B2 * 4/2018 Zhai ...................... H01L 25/105
10,056,327 B2 * 8/2018 Zhai ......................... H10D 1/20
10,082,633 B2 * 9/2018 Schaevitz ............ G02B 6/4228
10,115,677 B2 * 10/2018 Lee ....................... H01L 23/552
10,147,711 B2 * 12/2018 Bibl ...................... H01L 25/167
10,181,455 B2 * 1/2019 Zhai .................... H01L 25/0657
10,267,988 B2 * 4/2019 Huang ..................... G02B 6/13
10,267,990 B1 * 4/2019 Yu ......................... G02B 6/124
10,332,937 B2 * 6/2019 Furuya .................... H01L 23/13
10,371,893 B2 * 8/2019 Yu ......................... G02B 6/124
10,459,159 B2 * 10/2019 Huang ................. G02B 6/4239
10,461,022 B2 10/2019 Wu et al.
10,483,253 B1 * 11/2019 Hu ...................... H01L 23/5389
10,515,827 B2 * 12/2019 Jeng ...................... H01L 25/105
10,522,475 B2 * 12/2019 Lee ....................... H01L 23/552
10,535,597 B2 * 1/2020 Chen ................. H01L 23/49827
10,535,642 B2 * 1/2020 Bibl ...................... H01L 25/167
10,586,909 B2 * 3/2020 Das ..................... H01L 23/5384
10,598,875 B2 3/2020 Xie
10,602,612 B1 * 3/2020 Hoang ................... H05K 3/284
10,624,214 B2 * 4/2020 Salehi .................. H05K 1/0224
10,631,410 B2 * 4/2020 Provencher .......... H05K 3/0014
10,698,156 B2 * 6/2020 Coolbaugh .............. G02B 6/12
10,742,217 B2 * 8/2020 Dabral .................... H01L 24/20
10,756,622 B2 * 8/2020 Dabral ...................... G05F 3/10
10,770,433 B1 * 9/2020 Zhong ................... H01L 25/105
10,784,220 B2 * 9/2020 Jeng .................... H01L 21/6835
10,825,696 B2 * 11/2020 Yu ......................... H01L 21/561
10,847,468 B2 * 11/2020 Kim .................... H01L 23/5385
10,867,925 B2 * 12/2020 Jeng ...................... H01L 21/568
10,886,263 B2 * 1/2021 Chen ................... H01L 23/5384
10,910,321 B2 * 2/2021 Hsieh .................. H01L 23/3677
10,943,869 B2 * 3/2021 Zhai ........................ H01L 24/19
10,950,591 B2 * 3/2021 Hu ........................ H01L 25/167
10,957,678 B2 * 3/2021 Bibl ...................... H01L 25/167
10,985,118 B2 4/2021 Koren et al.
10,993,317 B2 * 4/2021 He ........................ H01L 25/167
11,031,381 B2 * 6/2021 Chen ....................... H01L 21/56
11,049,841 B2 * 6/2021 Bernier ................. H01L 23/552
11,054,597 B2 7/2021 Raghunathan et al.
11,056,373 B2 * 7/2021 Zhai .................... H01L 23/5389
11,063,013 B2 * 7/2021 Chen .................. H01L 23/5386
11,069,665 B2 * 7/2021 Ramachandran ....... H01L 22/20
11,133,296 B2 * 9/2021 Jeong .................... H01L 25/105
11,150,404 B2 * 10/2021 Huang .................. G02B 6/428
11,183,474 B2 * 11/2021 Lu ...................... H01L 25/0657
11,209,598 B2 12/2021 Janta-Polczynski et al.
11,257,763 B2 * 2/2022 Lu ...................... H01L 23/5384
11,264,345 B2 * 3/2022 Enquist ............... H01L 25/0657
11,270,956 B2 * 3/2022 Huang .................. H01L 23/562
11,309,895 B2 * 4/2022 Dabral .................... H01L 24/20
11,313,741 B2 * 4/2022 Lupo ...................... G01K 13/20
11,315,805 B2 * 4/2022 Yu ......................... H01L 21/561
11,322,453 B2 * 5/2022 Hsu ..................... H01L 21/6835
11,347,001 B2 * 5/2022 Chen ........................ G02B 6/30
11,362,076 B2 * 6/2022 Bibl ...................... H01L 25/167
11,374,381 B1 * 6/2022 Kriman ................ H10H 20/853
11,387,177 B2 * 7/2022 Chien ................. H01L 23/5389
11,462,461 B2 * 10/2022 Zhang .............. H01L 23/49816
11,493,713 B1 * 11/2022 Mendoza ........... G02B 6/12002
11,493,714 B1 * 11/2022 Mendoza ........... G02B 6/12002
11,508,692 B2 * 11/2022 Yeh ......................... H01L 24/97
11,515,261 B2 * 11/2022 Shanmugam ......... H01L 21/568
11,532,563 B2 * 12/2022 Shanmugam ....... H01L 23/5389
11,545,438 B2 * 1/2023 Hsieh .................. H01L 21/6835
11,550,108 B1 * 1/2023 Mendoza ........... G02B 6/12002
11,587,909 B2 * 2/2023 Zhong .................. H01L 25/105
11,594,494 B2 * 2/2023 Zhai ........................ H01L 24/19
11,610,864 B2 * 3/2023 Chen ................ H01L 23/49816
11,651,976 B2 * 5/2023 Renjan .................. H01L 23/295 257/676
11,676,953 B2 * 6/2023 Bibi ...................... H01L 25/167 257/82
11,694,939 B2 * 7/2023 Huang ................ H01L 23/3185 257/787
11,728,266 B2 * 8/2023 Dabral .................. H01L 23/522 257/737
11,764,123 B2 * 9/2023 Huang ................ H01L 23/3185 257/787
11,817,383 B2 * 11/2023 Lupo ...................... G01K 13/20
11,824,029 B2 * 11/2023 Chen .................. H01L 23/5386
11,831,312 B2 * 11/2023 Dabral .................... H01L 24/20
11,837,566 B2 * 12/2023 Lu ...................... H01L 25/0657
11,841,541 B2 * 12/2023 Chang .................. G02B 6/4274
11,846,802 B2 * 12/2023 Chen ................... G02B 6/4295
11,881,678 B1 * 1/2024 Bishop .................... H01S 5/405
11,892,693 B1 * 2/2024 Mendoza ........... G02B 6/12002
11,908,706 B2 * 2/2024 Yu ......................... H01L 21/561
12,046,558 B2 * 7/2024 Lu ...................... H01L 23/5384
12,074,077 B2 * 8/2024 Shanmugam ......... H01L 21/568
12,074,244 B2 * 8/2024 Liu ....................... G06F 1/1635
12,087,749 B2 * 9/2024 Bibl ...................... H01L 25/167
12,119,304 B2 * 10/2024 Dabral ................ H01L 23/5384
12,197,023 B1 * 1/2025 Aggarwal ............ G02B 6/4255
12,210,187 B2 * 1/2025 Chen ................... H01L 23/5386
12,230,513 B2 * 2/2025 Yu ......................... H01L 21/561
12,242,123 B1 * 3/2025 Mendoza ........... G02B 6/12002
12,283,549 B2 * 4/2025 Zhai ........................ H01L 24/19
12,368,137 B2 * 7/2025 Zhong .................. H01L 25/105
12,392,974 B2 * 8/2025 Aggarwal ................ G02B 6/32
12,405,434 B2 * 9/2025 Aggarwal .............. G02B 6/124
12,431,453 B2 * 9/2025 Lu ...................... H01L 25/0657
2002/0076170 A1 6/2002 Murali et al.
2004/0258124 A1 12/2004 Lissotschenko
2005/0100264 A1 5/2005 Kim et al.

(56) References Cited

U.S. PATENT DOCUMENTS

2005/0224946 A1* 10/2005 Dutta ................. G02B 6/12002 257/686
2005/0280141 A1* 12/2005 Zhang ..................... H01L 23/36 257/E23.101
2006/0056765 A1 3/2006 Hwang et al.
2006/0251360 A1 11/2006 Lu et al.
2007/0158832 A1* 7/2007 Takaike .................. H01L 24/82 257/734
2007/0297713 A1 12/2007 Lu et al.
2008/0182364 A1 7/2008 Zhang
2010/0078635 A1* 4/2010 Kuroda ................... H01L 25/18 438/107
2010/0230825 A1* 9/2010 von Kaenel .......... H01L 25/105 257/777
2010/0327424 A1* 12/2010 Braunisch ........... H01L 23/5385 257/692
2011/0019960 A1 1/2011 Matsubara et al.
2011/0044367 A1* 2/2011 Budd .................... H10F 39/107 257/E31.127
2011/0068459 A1* 3/2011 Pagaila ................. H01L 21/568 257/E23.141
2012/0083052 A1* 4/2012 von Kaenel .......... H01L 25/105 257/E21.531
2013/0084039 A1* 4/2013 Doany .................. H01L 21/302 438/31
2013/0210214 A1* 8/2013 Dallesasse ............. H10F 39/18 438/458
2013/0230274 A1 9/2013 Fish
2014/0029639 A1* 1/2014 Zarbock ............... G02B 6/4214 372/50.1
2014/0061946 A1* 3/2014 Zhao ..................... H01L 23/147 257/774
2014/0084425 A1* 3/2014 Arnold .................... H01L 24/19 257/738
2014/0210106 A1* 7/2014 Zhai .................... H01L 23/3128 438/118
2014/0210107 A1* 7/2014 Zhai ...................... H01L 23/498 257/777
2014/0225222 A1* 8/2014 Yu ........................... H10D 1/68 257/532
2014/0269804 A1* 9/2014 Lai ..................... G02B 6/12004 372/50.21
2014/0321804 A1* 10/2014 Thacker ............... G02B 6/4274 385/14
2015/0169011 A1* 6/2015 Bibl ...................... H01L 25/167 345/175
2015/0171063 A1* 6/2015 Zhai ........................ H01L 25/50 257/713
2015/0296622 A1* 10/2015 Jiang ...................... H05K 1/028 361/749
2015/0303149 A1* 10/2015 Zhai ...................... H01L 23/552 257/659
2016/0148904 A1* 5/2016 Zhai ...................... H01L 21/561 438/109
2016/0155723 A1* 6/2016 Lou ..................... H01L 25/0652 257/774
2016/0218082 A1* 7/2016 Lee ..................... H01L 23/5389
2016/0259368 A1* 9/2016 Bibl ...................... H01L 25/167
2016/0260684 A1* 9/2016 Zhai ...................... H01L 21/568
2016/0260695 A1* 9/2016 Chung ................ H01L 23/5389
2016/0270213 A1* 9/2016 Salehi .................... B33Y 80/00
2016/0300813 A1* 10/2016 Zhai ...................... H01L 21/561
2016/0315071 A1* 10/2016 Zhai ...................... H01L 25/105
2016/0358889 A1* 12/2016 Lai .......................... H01L 25/50
2016/0379959 A1* 12/2016 We ...................... H01L 25/0655 257/773
2017/0018497 A1* 1/2017 Zhai ......................... H10D 1/20
2017/0025380 A1* 1/2017 Zhai .................... H01L 23/5389
2017/0031115 A1* 2/2017 Schaevitz ............ G02B 6/4228
2017/0047312 A1* 2/2017 Budd ................... G02B 6/1221
2017/0053897 A1* 2/2017 Lai ...................... H01L 25/0657
2017/0062383 A1* 3/2017 Yee ..................... H01L 25/0652
2017/0062390 A1* 3/2017 Chua ..................... H01L 21/561
2017/0108655 A1* 4/2017 Zarbock ............... G02B 6/4214
2017/0141088 A1* 5/2017 Zhai ...................... H01L 25/105
2017/0141091 A1* 5/2017 Bibl ...................... H01L 25/167
2017/0179039 A1* 6/2017 Lee ....................... H01L 23/552
2017/0199328 A1* 7/2017 Shubin ................. G02B 6/1228
2017/0256489 A1* 9/2017 Zhai ......................... H10D 1/20
2017/0301631 A1* 10/2017 Lee ....................... H01L 23/552
2017/0358552 A1* 12/2017 Breiner ................. H01L 23/552
2018/0092213 A1* 3/2018 Provencher .......... H05K 3/0014
2018/0102470 A1* 4/2018 Das ..................... H01L 23/5384
2018/0175113 A1* 6/2018 Furuya ................... H01L 23/13
2018/0190632 A1* 7/2018 Bibl ...................... H01L 25/167
2018/0204791 A1* 7/2018 Chen ................. H01L 23/49827
2018/0204820 A1* 7/2018 Zhai .................... H01L 25/0657
2018/0286824 A1* 10/2018 Jeng .................... H01L 21/6835
2018/0314003 A1* 11/2018 Coolbaugh .............. G02B 6/12
2018/0358298 A1* 12/2018 Zhai ........................ H01L 24/19
2018/0372968 A1* 12/2018 McKay ................... H01S 5/183
2019/0004247 A1* 1/2019 Huang ............... G02B 6/12002
2019/0027445 A1* 1/2019 Lee ....................... H01L 23/552
2019/0043845 A1* 2/2019 Bibl ...................... H01L 25/167
2019/0057932 A1* 2/2019 Wu ......................... H01L 23/04
2019/0103386 A1* 4/2019 Chen ................... H01L 23/5384
2019/0131284 A1* 5/2019 Jeng ...................... H01L 25/105
2019/0137706 A1 5/2019 Xie
2019/0157333 A1* 5/2019 Tsai ...................... H10F 39/809
2019/0162901 A1* 5/2019 Yu .......................... G02B 6/124
2019/0164905 A1* 5/2019 Hsieh .................. H01L 23/3677
2019/0237419 A1* 8/2019 Enquist ............... H01L 25/0657
2019/0250327 A1* 8/2019 Huang ................. G02B 6/4274
2019/0317287 A1 10/2019 Raghunathan et al.
2019/0319626 A1* 10/2019 Dabral .................... H01L 24/20
2019/0369329 A1* 12/2019 Huang ..................... G02B 6/34
2020/0006089 A1* 1/2020 Yu ......................... H01L 21/561
2020/0027837 A1* 1/2020 Jeng ...................... H01L 21/568
2020/0043853 A1* 2/2020 Kim .................... H01L 23/5385
2020/0098734 A1* 3/2020 Jeong ................... H01L 25/105
2020/0107435 A1* 4/2020 He ........................ H01L 25/167
2020/0135707 A1* 4/2020 Chen ....................... H01L 21/56
2020/0161288 A1* 5/2020 Bibl ...................... H01L 25/167
2020/0176427 A1* 6/2020 Ramachandran ....... H01L 22/14
2020/0204067 A1* 6/2020 Dabral ...................... G05F 3/10
2020/0258875 A1* 8/2020 Hu ........................ H01L 25/167
2020/0273822 A1 8/2020 Koren et al.
2020/0273843 A1* 8/2020 Zhong ................... H01L 25/105
2020/0279840 A1 9/2020 Janta-Polczynski et al.
2020/0365544 A1* 11/2020 Chen ................... H01L 23/5386
2020/0389172 A1* 12/2020 Dabral .................... H01L 24/20
2020/0395281 A1* 12/2020 Chien ................. H01L 23/3114
2021/0020610 A1* 1/2021 Zhong ................... H01L 25/105
2021/0074553 A1* 3/2021 Yu ......................... H01L 21/561
2021/0074682 A1* 3/2021 Chen ................. H01L 23/49816
2021/0090908 A1* 3/2021 Renjan .................. H01L 23/295
2021/0096310 A1* 4/2021 Chang .................. G02B 6/4274
2021/0134751 A1* 5/2021 Lu ....................... H01L 25/0657
2021/0151411 A1* 5/2021 Cho ........................ H01L 24/06
2021/0159180 A1* 5/2021 Zhai ........................ H01L 24/19
2021/0159185 A1* 5/2021 Hsu ..................... H01L 21/6835
2021/0167016 A1* 6/2021 Lu ....................... H01L 23/5384
2021/0181039 A1* 6/2021 Lupo ...................... G01K 13/20
2021/0202389 A1* 7/2021 Hsieh .................. H01L 21/6835
2021/0202436 A1* 7/2021 Yeh ......................... H01L 24/13
2021/0265330 A1* 8/2021 Bibl ...................... H01L 25/167
2021/0305173 A1* 9/2021 Huang .................. H01L 23/562
2021/0311252 A1* 10/2021 Chen ........................ G02B 6/30
2021/0343671 A1* 11/2021 Chen ................... H01L 23/5386
2021/0366802 A1* 11/2021 Huang .................. H01L 25/167
2021/0384113 A1* 12/2021 Zhang ............... H01L 23/49816
2022/0071013 A1* 3/2022 Morrison ............... H05K 1/181
2022/0084972 A1* 3/2022 Lu ....................... H01L 25/0657
2022/0085231 A1* 3/2022 Liu ........................ G04G 17/04
2022/0093522 A1* 3/2022 Shanmugam ....... H01L 23/5389
2022/0093523 A1* 3/2022 Shanmugam ........... H10F 77/93
2022/0102280 A1* 3/2022 Dabral ................ H01L 23/5384
2022/0157680 A1* 5/2022 Shanmugam ......... H01L 21/568
2022/0181264 A1* 6/2022 Lu ....................... H01L 23/5384
2022/0199517 A1* 6/2022 Dabral .................. H01L 23/522
2022/0231687 A1* 7/2022 Dabral .................... H01L 24/20
2022/0254656 A1* 8/2022 Yu ......................... H01L 21/561

(56) References Cited

U.S. PATENT DOCUMENTS

| | | | | |
|---|---|---|---|---|
| 2022/0260776 | A1* | 8/2022 | Chen | H01L 23/5386 |
| 2022/0270955 | A1* | 8/2022 | Lupo | G01K 13/20 |
| 2022/0278086 | A1* | 9/2022 | Bibl | H01L 25/167 |
| 2022/0336309 | A1* | 10/2022 | Huang | H01L 25/167 |
| 2023/0154897 | A1* | 5/2023 | Zhong | H01L 25/105<br>257/419 |
| 2023/0223348 | A1* | 7/2023 | Zhai | H01L 24/19<br>257/737 |
| 2023/0361098 | A1* | 11/2023 | Bibl | H01L 25/167 |
| 2024/0085619 | A1* | 3/2024 | Chen | H01L 23/5386 |
| 2024/0113061 | A1* | 4/2024 | Lu | H01L 25/0657 |
| 2024/0145257 | A1* | 5/2024 | Yu | H01L 21/561 |
| 2024/0379567 | A1* | 11/2024 | Lu | H01L 23/5384 |

OTHER PUBLICATIONS

Li et al., Wafer Level Back to Back Hybrid Bonding for Multiple Wafer Stacking, IEEE 22nd Electronics Packaging Technology Conference (EPTC), pp. 468-471 (Year: 2020).*

Theil et al., Recent Developments in Fine Pitch Wafer-To-Wafer Hybrid Bonding with Copper Interconnect, 2019 International Wafer Level Packaging Conference (IWLPC), pp. 1-6, (Year: 2019).*

Duan et al., A novel 3D stacking method for Opto-electronic dies on CMOS ICs, Opt. Express 20, B386-B392 (2012) (Year: 2012).*

Grabherr et al., VCSEL arrays for high-aggregate bandwidth of up to 1.34 Tbps, Proc. SPIE 9001, Vertical-Cavity Surface-Emitting Lasers XVIII, 900105 (Feb. 27, 2014); https://doi.org/10.1117/12.2039226 (Year: 2014).*

Ro et al., Evaluating the Impact of Optical Interconnects on a Multi-Chip Machine-Learning Architecture, Electronics 2018, 7, 130; doi: 10.3390/electronics7080130 (Year: 2018).*

Luo et al., DaDianNao: A Neural Network Supercomputer, IEEE Transactions on Computers, vol. 66, No. 1, Jan. 2017 (Year: 2017).*

Lin et al., Demonstration of an Optical Chip-to-Chip Link in a 3D Integrated Electronic-Photonic Platform, Technical Report No. UCB/EECS-2017-193 http://www2.eecs.berkeley.edu/Pubs/TechRpts/2017/EECS-2017-193.html (Year: 2017).*

Stojanović et al., "High-density 3D electronic-photonic integration," 2015 Fourth Berkeley Symposium on Energy Efficient Electronic Systems (E3S), Berkeley, CA, USA, 2015, pp. 1-2, doi: 10.1109/E3S.2015.7336803. (Year: 2015).*

Lau, John H., State-of-the-Art and Outlooks of Chiplets Heterogeneous Integration and Hybrid Bonding, IMAPS 2021—54th International Symposium on Microelectronics (Year: 2021).*

Settaluri et al., Demonstration of an optical chip-to-chip link in a 3D integrated electronic-photonic platform, ESSCIRC Conference 2015—41st European Solid-State Circuits Conference (ESSCIRC), Graz, Austria, 2015, pp. 156-159 (Year: 2015).*

* cited by examiner 310
302
300-1

310
302
312
313
314
313
312
300-2

320
303
300-3

320
303
322
324
322
300-4

320
310
321
328
318
322
312
313
332
319
330
324
314
305

309
301
300-12

310
302
600-1

310
302
312
313
314
313
312
600-2

320
303
600-3

320
303
322
324
332
600-4

320
310
322
312
313
319
324
314
313
319
332
312
600-6

320
310
322
312
313
319
324
314
305
313
319
332
312
309
301
600-7

320
310
621
628
618
322
312
313
319
324
314
305
330
313
319
332
312
309
301
628
618
600-11
621

HETEROGENEOUS PACKAGING INTEGRATION OF PHOTONIC AND ELECTRONIC ELEMENTS

CROSS-REFERENCE TO RELATED APPLICATIONS

The present application is a division of U.S. patent application Ser. No. 17/191,477, filed on Mar. 3, 2021, which is incorporated by reference herein in its entirety.

BACKGROUND

Photonic integrated circuits (PICs), e.g. high performance servers, utilize photonic and electronic elements to implement various functions with respect to data processing and computing. While the electronic elements may include central processing unit (CPU), graphics processing unit (GPU), I/O buffers, etc.; the photonic elements may include waveguide, optical amplifier, modulator, photodiode, and other elements for generating, emitting, transmitting, modulating, signal processing, amplifying, and/or detecting light. In a PIC, a photonic die including photonic elements is often driven by an electronic die including electronic elements.

In an existing PIC, photonic dies and electronic dies are integrated on a board, e.g. a printed circuit board (PCB). As such, a computing or processing element in an electronic die has to go through wires and devices on the board to communicate with a photonic die; and there is no direct mechanism to drive a modulator in a photonic die by an electronic die. This causes a larger integration area, a higher latency, a higher power consumption, and a lower bandwidth for signal processing and communications in the PIC.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The present teaching discloses an integration of high performance computing (HPC) processors, photonic dies, and electronic dies using heterogeneous three-dimensional (3D) package solutions. Compute dies with advanced process nodes and photonic dies are in a top layer on top of the assembly. The bottom layer includes mature nodes, e.g. input/output (I/O) buffers, memory controller, peripheral component interconnect express (PCIe) controller, and other chipset function nodes. One or more electronic dies with analog functionality are in the bottom layer as well, serving as interfaces and/or drivers for the photonic dies. This enables a close proximity of compute and photonic dies within the package.

The disclosed method and package can be applied to any application with 3D chipset integration and high bandwidth data transfer. For example, the disclosed integration can be well applied to next generation servers, which have a high bandwidth data transfer requirement. The close integration of photonic die with the compute die enables a low power consumption and a high transmission bandwidth, e.g. for data transmission between servers connected by fibers.

In one embodiment, the package integrates heterogeneous processor elements and photonic elements with a direct hybrid bonding. The processor elements may include, e.g. central processing unit (CPU), graphics processing unit (GPU), field programmable gate array (FPGA), machine learning engines, etc. The photonic elements may include modulators, photodiodes, waveguides, optical amplifiers, etc. Photonic dies and computing elements with advanced nodes are on top layer of the heterogeneous stack; electronic dies (or photonic interface dies) with analog and chipset functions and mature process nodes are on the bottom layer of the heterogeneous stack. The direct hybrid bonding of the top and bottom layers enables a face-to-face stacking, which causes a high bandwidth communication between processor elements and photonic elements, and enables a simple low-power signaling between dies. In addition, the segmentation of computing and chipset/analog functionalities between advanced and mature nodes can save cost of the IC package.

Figure 1A:
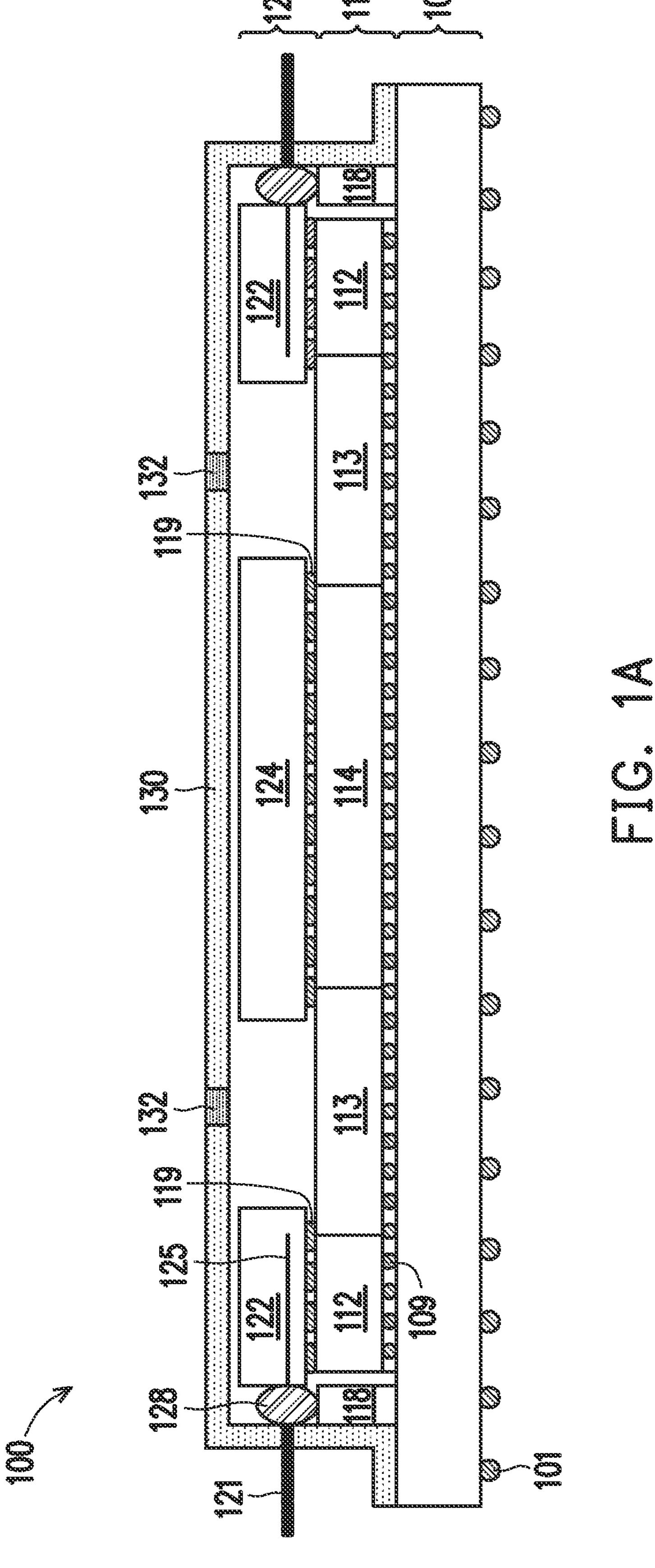
FIG. 1A illustrates a cross-sectional view of an exemplary integrated circuit (IC) package, in accordance with some embodiments of present disclosure.

FIG. 1A illustrates a cross-sectional view of an exemplary integrated circuit (IC) package 100, in accordance with some embodiments of present disclosure. It is noted that the package 100 is merely an example, and is not intended to limit the present disclosure. Accordingly, it is understood that additional functional blocks may be provided in or coupled to the package 100 of FIG. 1A, and that some other functional blocks may only be briefly described herein.

Referring to FIG. 1A, the package 100 comprises a package substrate 105, a first layer 110 on the package substrate 105, and a second layer 120 bonded onto the first layer 110. The first layer 110 comprises one or more electronic dies 112; and the second layer 120 comprises one or more photonic dies 122. As shown in FIG. 1A, with the second layer 120 bonded onto the first layer 110, a photonic die 122 is bonded onto a corresponding electronic die 112 using hybrid bonds 119. The direct bonding may induce an ultra-fine pitch of less than 10 micrometers. That is, a pitch or vertical distance between the electronic die 112 and the corresponding photonic die 122 can be less than 10 micrometers. The electronic die 112 may include a driver for the corresponding photonic die 122, which means the electronic die 112 can send signals into the photonic die 122 for computation and processing.

As shown in FIG. 1A, the first layer 110 further includes a bottom die 114 separated from each adjacent electronic die 112 by a via 113, e.g. a through silicon via (TSV). The TSVs 113 may comprise electrically conductive paths that extend vertically through the first layer 110 and provide electrical connectivity between the second layer 120 and the package substrate 105.

The second layer 120 further includes a top die 124 bonded onto the bottom die 114 using hybrid bonds 119. In one embodiment, the pitch between the bottom die 114 and the top die 124 after bonding can be less than 10 micrometers. As shown in FIG. 1A, the top die 124 is separated from adjacent photonic dies 122 in the second layer 120. In one embodiment, the top die 124 may be a compute or processor die having a higher operation frequency than the photonic die 122.

In one embodiment, the bottom die 114 and the electronic dies 112 are fabricated in a mature node, and contain analog and chipset functions including drivers for the photonic dies 122. While the electronic die 112 and the photonic die 122 on top are stacked face-to-face with 3D hybrid bonding, each bottom die 114 and/or electronic die 112 can be tested earlier in the package stage to select out known good dies.

As shown in FIG. 1A, the first layer 110 is attached to the package substrate 105 with bumps 109, e.g. using a flip-chip (C4) interconnection method. The package substrate 105 may be further coupled to a printed circuit board (PCB) with package bumps 101. In one embodiment, the TSVs 113 may comprise electrically conductive paths that extend vertically to provide electrical connectivity between the top die 124 in the second layer 120 and the bumps 109 on the package substrate 105.

As shown in FIG. 1A, the package 100 further comprises a pedestal 118 adjacent to each electronic die 112 in the first layer 110. The pedestal 118 is formed on the package substrate 105. The package 100 further comprises a polymer lens 128 deposited onto each pedestal 118. Each polymer lens 128 is aligned to a corresponding photonic die 122 in the second layer 120, and configured to guide light in or out of the photonic die 122.

As shown in FIG. 1A, the package 100 further comprises an optical fiber 121 aligned and attached to each polymer lens 128, to guide the light in or out of the polymer lens 128 through an edge coupler or a grating coupler which may be located within the polymer lens 128. The polymer lens 128 is disposed at a position to couple the light transmission between the optical fiber 121 and the photonic die 122. In one embodiment, an edge coupler or grating coupler is located between the optical fiber 121 and the polymer lens 128. In another embodiment, an edge coupler or grating coupler is located between the polymer lens 128 and the photonic die 122. In another embodiment, one edge coupler or grating coupler is located between the optical fiber 121 and the polymer lens 128; and another edge coupler or grating coupler is located between the polymer lens 128 and the photonic die 122.

As shown in FIG. 1A, the package 100 further comprises a heat spreader 130 formed on and in contact with the second layer 120. The heat spreader 130 comprises a plurality of thermal breaks 132 each of which is located between the top die 124 and a photonic die 122 adjacent to the top die 124. The insulating thermal breaks 132 can avoid or reduce heat transfer between the top die 124 and the adjacent photonic die 122. According to various embodiments, while the heat spreader 130 may be made of a heat conductive material, e.g. copper, silver, aluminum, etc.; the thermal breaks 130 may be made of a thermal isolation material, e.g. a porous film, a wax film, a die attach film (DAF), an aerogel, a tape, a solder paste, an adhesive, and/or a thermal grease.

Figure 1B:
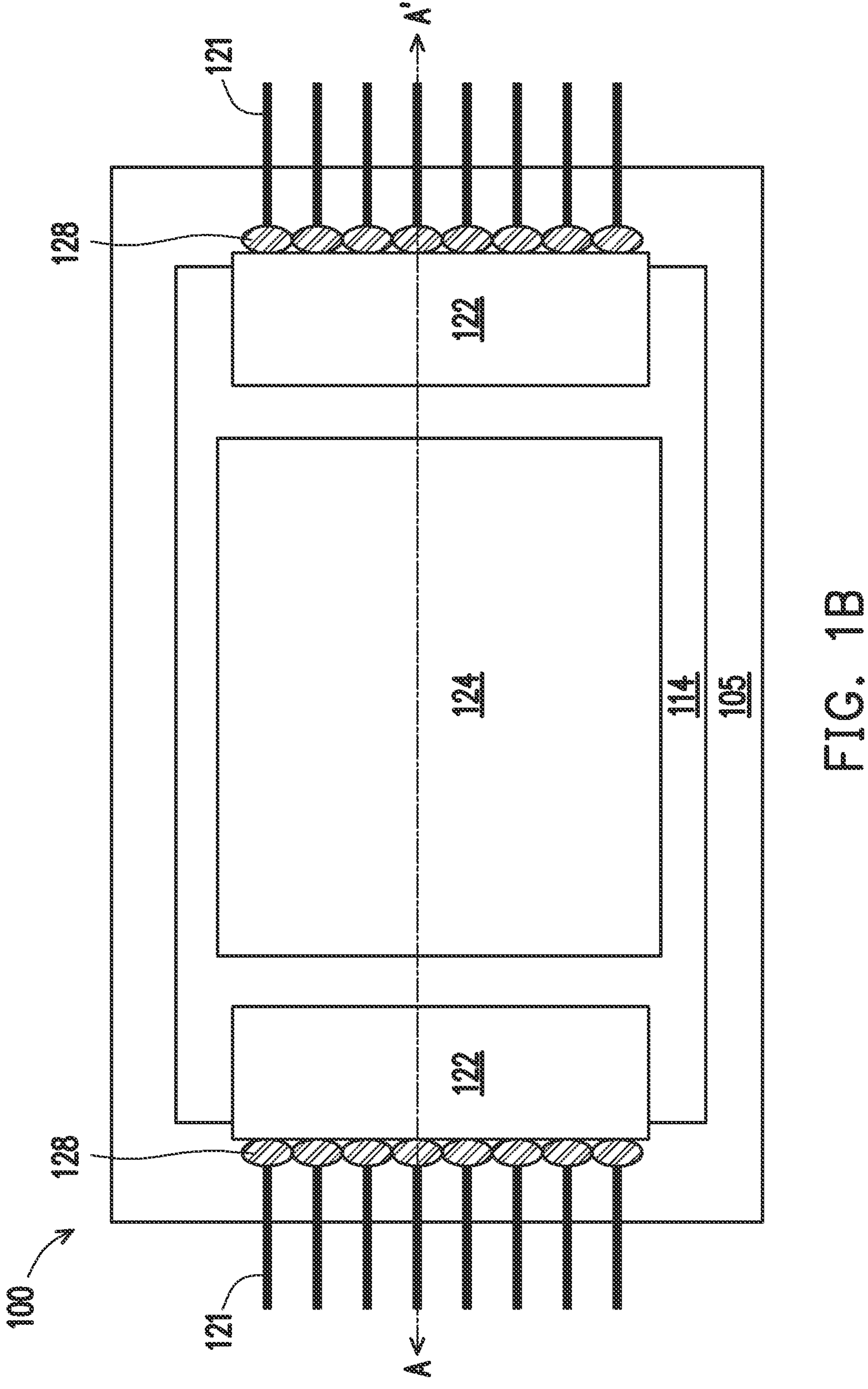
FIG. 1B illustrates a top view of an exemplary IC package, in accordance with some embodiments of the present disclosure.

FIG. 1B illustrates a top view of the exemplary IC package 100, in accordance with some embodiments of the present disclosure. The cross-sectional view of the package 100 in FIG. 1A is taken along the A-A' direction as shown in FIG. 1B. As shown in FIG. 1B, the package 100 comprises a plurality of lens arrays each of which comprises multiple lenses 128 and is aligned to a corresponding photonic die 122 in the second layer or the top layer. The package 100 comprises a plurality of fiber arrays each of which comprises multiple optical fibers 121 attached to a corresponding lens array. Each optical fiber 121 can be a single-mode or a multi-mode optical fiber. As shown in FIG. 1B, the number of the lenses 128 is the same as the number of optical fibers 121, such that each optical fiber is aligned and attached to a corresponding lens 128, which is configured to guide light transmission between the corresponding photonic die 122 and the corresponding optical fiber 121.

During operation, optical signals received from a remote server attached on one end of the optical fiber array can be coupled through the lens array to the corresponding photodetectors on the photonic die 122. Alternatively, optical signals received from a light source die or a light source in the photonic die 122 can be coupled through the lens array to the optical fiber array which can be further transmitted to the remote server.

In some embodiments, each photonic die 122 may comprise components (not shown) such as a laser driver, digital control circuit, photodetectors, waveguides, small form-factor pluggable (SFP) transceiver, High-speed phase modulator (HSPM), calibration circuit, distributed Mach-Zehnder Interferometer (MZI), grating couplers, light sources, (i.e., laser), etc. A grading coupler enables the coupling of optical signals between the optical fiber array and the corresponding photodetectors on the photonic die 122. Each grating coupler may comprise a plurality of gratings and a waveguide with designs to reduce refractive index contrast to reduce back reflection losses.

In some embodiments, each electronic die 112 may comprise circuits (not shown) including amplifiers, control circuit, digital processing circuit, at least one electronic circuit that provides the required electronic function of the package 100, and driver circuits for controlling elements in the corresponding photonic die 122.

In some embodiments, the top die 124 may comprise components (not shown) such as a CPU, a GPU, an artificial intelligence (AI) processor, a machine learning (ML) processor, a high bandwidth memory (HBM), a cache, and/or other components with a high operation frequency. In some embodiments, the bottom die 114 may comprise components (not shown) such as an I/O buffer, a chipset, a memory controller, a driver circuit, and/or other components with a low operation frequency. Each component during circuit design can be put into either a top die or a bottom die of the package, depending on different criteria. In various embodiments, compared to a component in the bottom die, each component in the top die has at least one of: a higher operation frequency, a higher clock frequency, a greater circuit area scaling capability (which means easier to scale down or reduce the circuit area and die area in future technology generations), or a higher memory speed. As such, the package 100 integrates heterogeneous types of photonic or electronic elements with a 3D hybrid bonding.

Figure 2A:
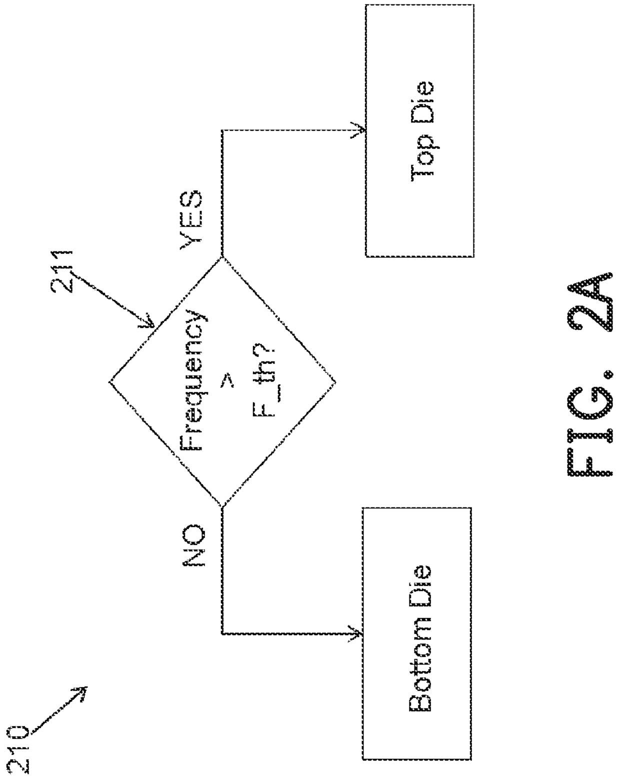
FIG. 2A illustrates an exemplary decision criterion on die selection for a photonic or electronic element, in accordance with some embodiments of the present disclosure.

FIG. 2A illustrates an exemplary decision criterion on die selection for a photonic or electronic element, in accordance with some embodiments of the present disclosure. As shown in FIG. 2A, the operation frequency of an element is compared to a frequency threshold F_th at step 211. When the operation frequency is larger than the frequency threshold F_th, the element is put into the top die. Otherwise, when the operation frequency is not larger than the frequency threshold F_th, the element is put into the bottom die. According to various embodiments, the frequency threshold F_th may be selected between 2 GHz and 4 GHz.

Figure 2B:
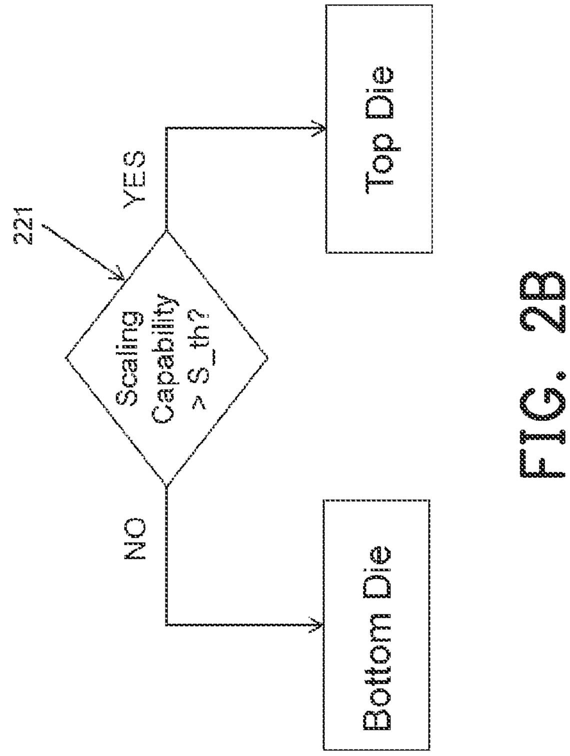
FIG. 2B illustrates another exemplary decision criterion on die selection for a photonic or electronic element, in accordance with some embodiments of the present disclosure.

FIG. 2B illustrates another exemplary decision criterion on die selection for a photonic or electronic element, in accordance with some embodiments of the present disclosure. As shown in FIG. 2B, the scaling capability of an element is compared to a scaling threshold S_th at step 221. When the scaling capability is larger than the scaling threshold S_th, the element is put into the top die. Otherwise, when the scaling capability is not larger than the scaling threshold S_th, the element is put into the bottom die. In one embodiment, if the element scales from one generation to another, the element is put into the top die; otherwise, the element is put into the bottom die.

Figure 2C:
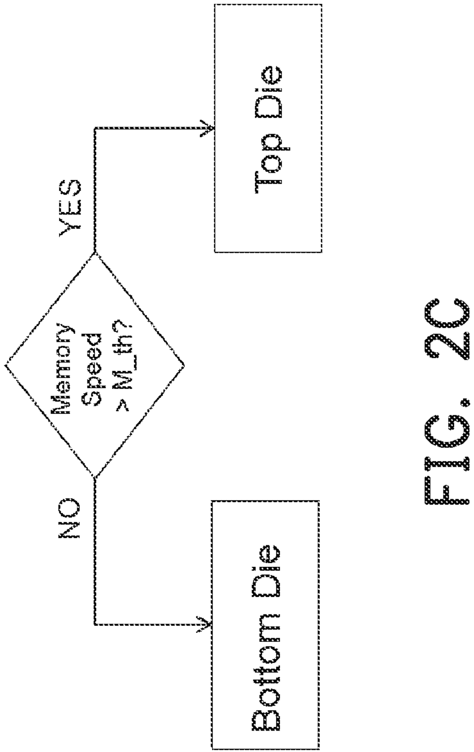
FIG. 2C illustrates yet another exemplary decision criterion on die selection for a photonic or electronic element, in accordance with some embodiments of the present disclosure.

FIG. 2C illustrates yet another exemplary decision criterion on die selection for a photonic or electronic element, in accordance with some embodiments of the present disclosure. As shown in FIG. 2C, the memory speed of an element is compared to a threshold M_th at step 231. When the memory speed is larger than the threshold M_th, the element is put into the top die. Otherwise, when the memory speed is not larger than the threshold M_th, the element is put into the bottom die. According to various embodiments, the threshold M_th is 2 GHz.

Figures 3A, 3B:
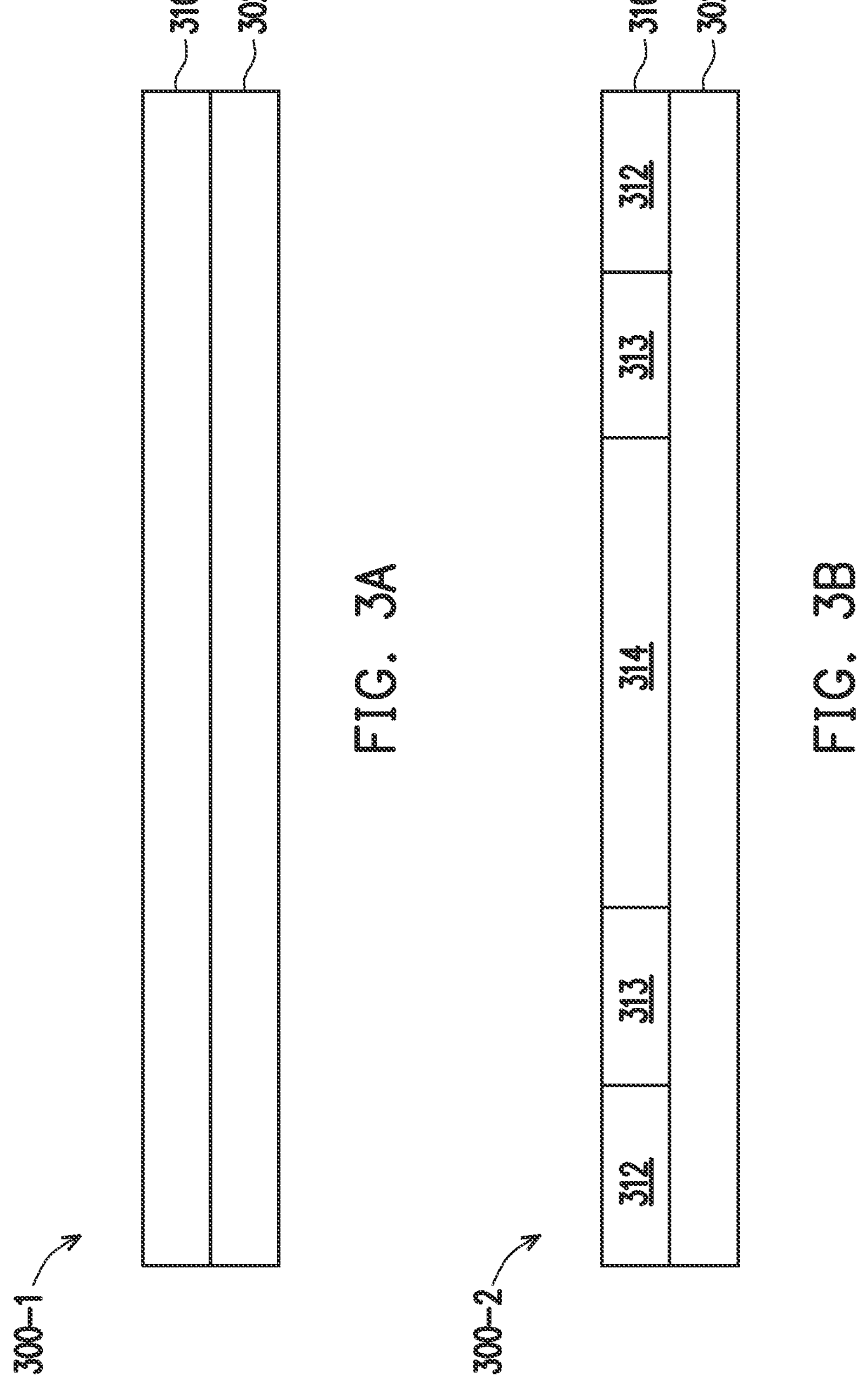
FIGS. 3A-3L illustrate cross-sectional views of an exemplary IC package at various stages of a fabrication process, in accordance with some embodiments of the present disclosure.

FIGS. 3A-3L illustrate cross-sectional views of an exemplary IC package at various stages of a fabrication process, in accordance with some embodiments of the present disclosure. FIG. 3A is a cross-sectional view of the package 300-1 including a first substrate 302 and a first layer 310 disposed on the first substrate 302, at one of the various stages of fabrication, according to some embodiments of the present disclosure. The first layer 310 may be formed of silicon or another semiconductor material.

FIG. 3B is a cross-sectional view of the package 300-2 including a bottom die 314 and two electronic dies 312 formed in the first layer 310 on the first substrate 302, at one of the various stages of fabrication, according to some embodiments of the present disclosure. While one bottom die and two electronic dies are shown in FIG. 3B, other numbers of the bottom dies and/or electronic dies may be formed in the first layer 310, according to various embodiments. As shown in FIG. 3B, the bottom die 314 is separated from each adjacent electronic die 312 by a via 313. Each of the bottom die 314 and the electronic dies 312 may be formed by: defining a geometric pattern from a photomask to the first layer 310 based on photolithography; etching the first layer 310 to determine an etched region in the first layer 310 based on the geometric pattern; epitaxially growing one or more semiconductor materials in the etched region to form the bottom die or electronic die; and performing chemical mechanical polishing (CMP) to smooth the surfaces of the first layer 310. Each of the vias 313 may be formed by a wet or dry etch procedure. The first layer 310 may include elements with chipset and photonic interface functionalities. In one embodiment, all of the electronic dies 312, the bottom die 314 and the vias 313 are formed together by: defining a geometric pattern from a photomask based on photolithography; etching the first layer 310 to determine etched regions in the first layer 310 based on the geometric pattern; epitaxially growing one or more semiconductor materials in the etched regions to form the electronic dies 312, the bottom die 314 and the vias 313.

Figures 3C, 3D:
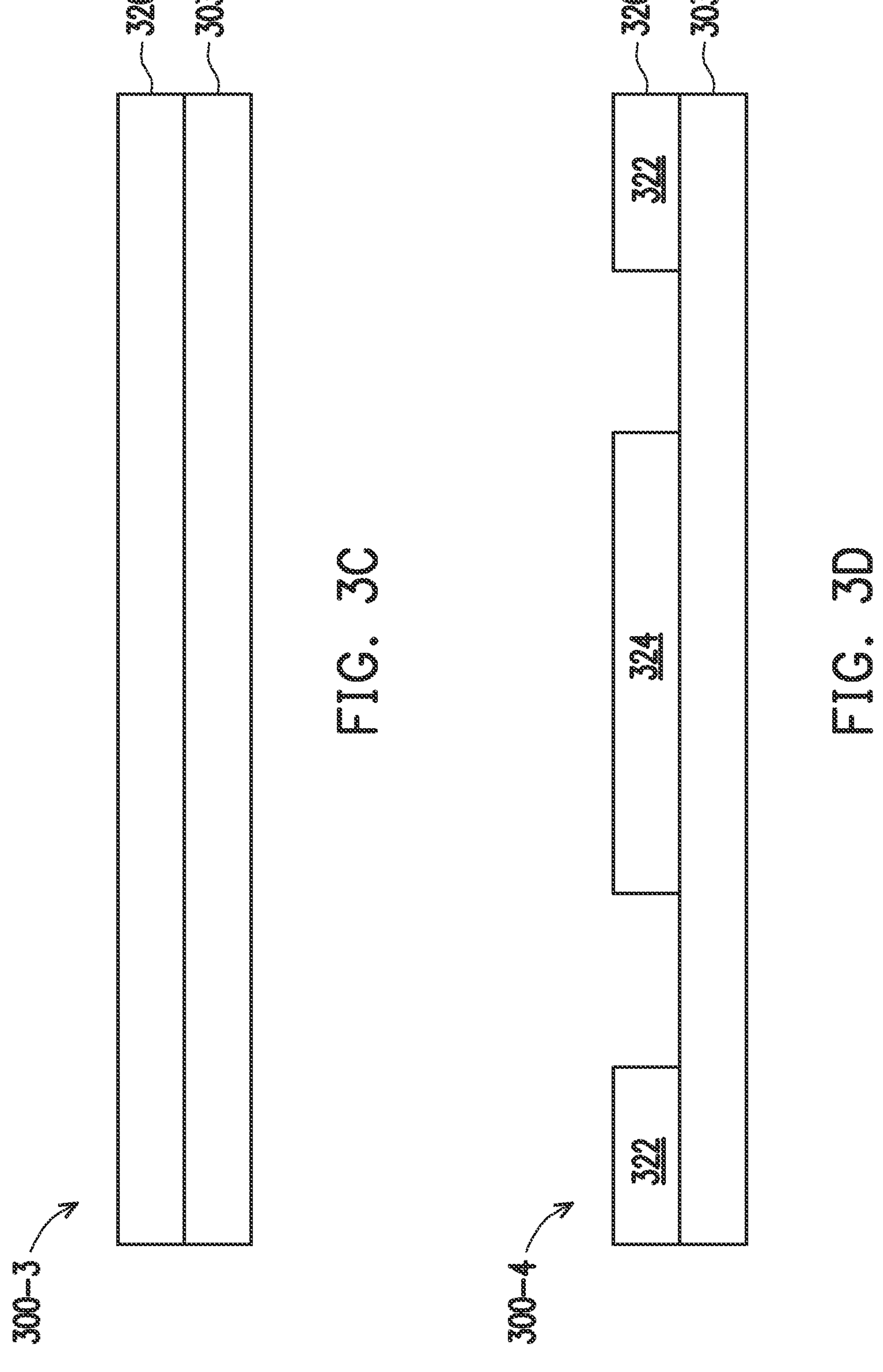

FIG. 3C is a cross-sectional view of the package 300-3 including a second substrate 303 and a second layer 320 disposed on the second substrate 303, at one of the various stages of fabrication, according to some embodiments of the present disclosure. The second layer 320 may be formed of silicon or another semiconductor material.

FIG. 3D is a cross-sectional view of the package 300-4 including a top die 324 and two photonic dies 322 formed in the second layer 320 on the second substrate 303, at one of the various stages of fabrication, according to some embodiments of the present disclosure. While one top die and two photonic dies are shown in FIG. 3D, other numbers of the top dies and/or photonic dies may be formed in the second layer 320, according to various embodiments. Each of the top die 324 and the photonic dies 322 may be formed by: defining a geometric pattern from a photomask to the second layer 320 based on photolithography; etching the second layer 320 to determine an etched region in the second layer 320 based on the geometric pattern; epitaxially growing one or more semiconductor materials in the etched region to form the top die or photonic die; and performing chemical mechanical polishing (CMP) to smooth the surfaces of the second layer 320. The second layer 320 may include elements with processor and photonic functionalities. In one embodiment, all of the elements including the photonic dies 322 and the top die 324 are formed together by: defining a geometric pattern from a photomask based on photolithography; etching the second layer 320 to determine etched regions in the second layer 320 based on the geometric pattern; epitaxially growing one or more semiconductor materials in the etched regions to form the photonic dies 322 and the top die 324. In one embodiment, some thermal isolation material may be inserted in the gaps between the photonic dies 322 and the top die 324 in the second layer 320.

Figure 3E:
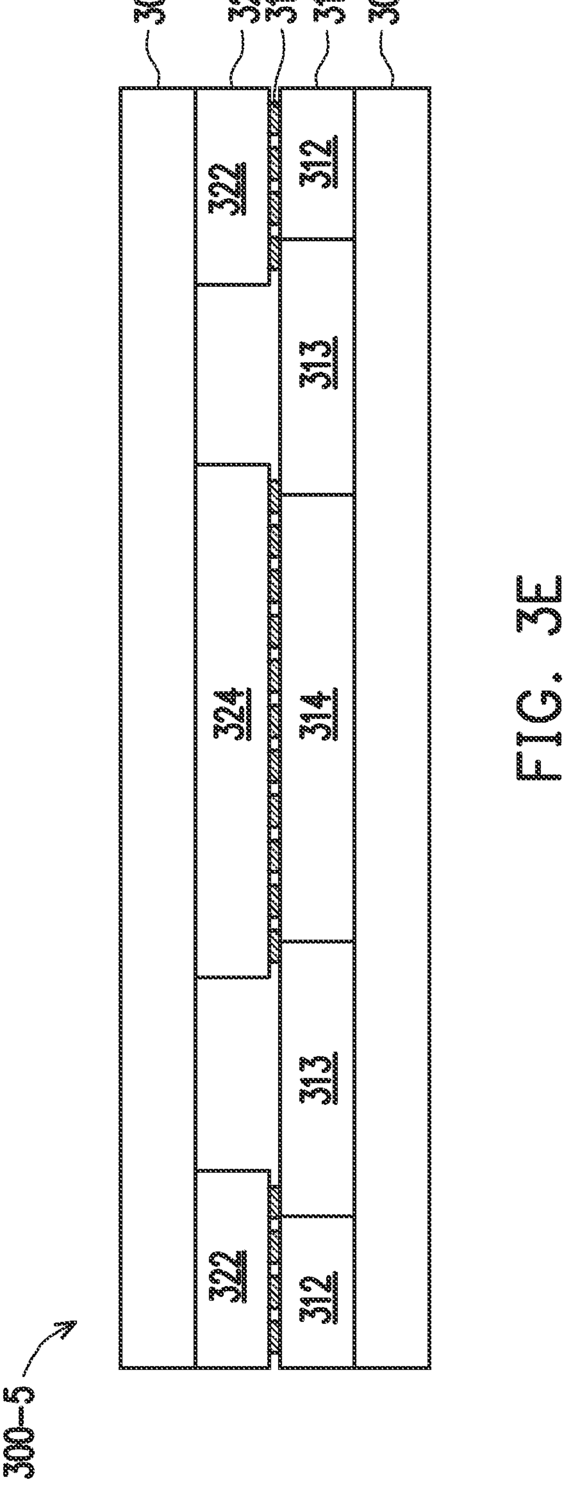

FIG. 3E is a cross-sectional view of the package 300-5 including the second layer 320 face-to-face stacked on the first layer 310, at one of the various stages of fabrication, according to some embodiments of the present disclosure. As shown in FIG. 3E, the second layer is flipped over and is bonded to the first layer via hybrid bonds 319. After the hybrid bonding, the top die 324 is bonded onto and in contact with the bottom die 314; and each photonic die 322 is bonded onto and in contact with a corresponding electronic die 312 which may include a driver circuit for controlling elements in the photonic die 322.

Figure 3F:
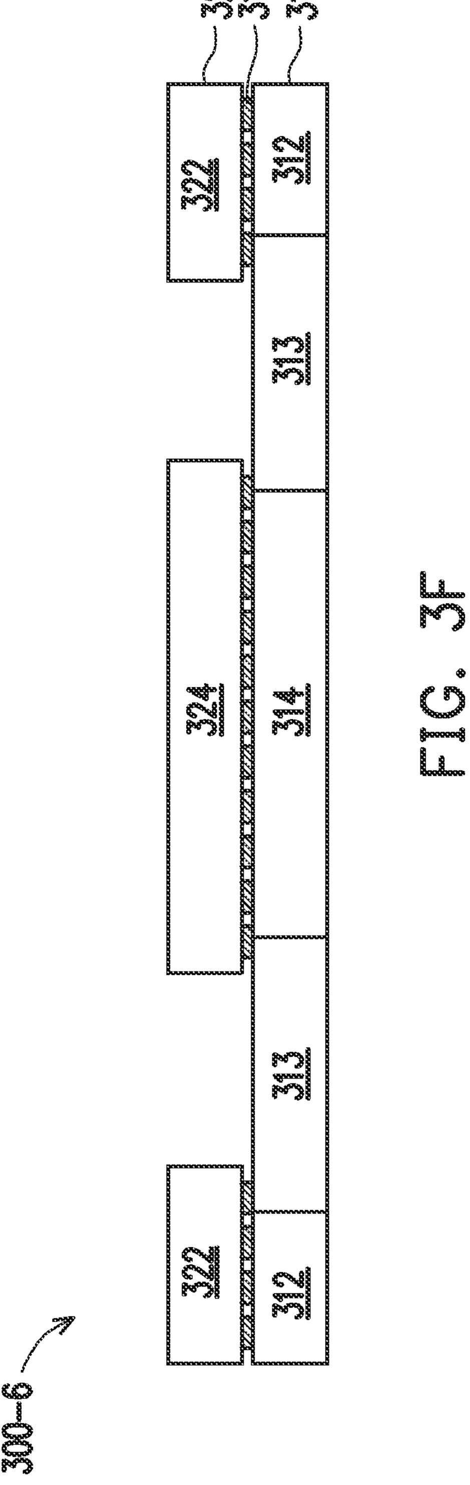

FIG. 3F is a cross-sectional view of the package 300-6, where the second substrate 303 and the first substrate 302 are removed after the bonding, at one of the various stages of fabrication, according to some embodiments of the present disclosure. This may be performed based on an etching process, a polishing process or a thinning process. The polishing process may be a chemical mechanical polishing (CMP) process. After removing the second substrate 303 and first substrate 302, the package 300-6 includes a bonded stack or bonded die.

Figure 3G:
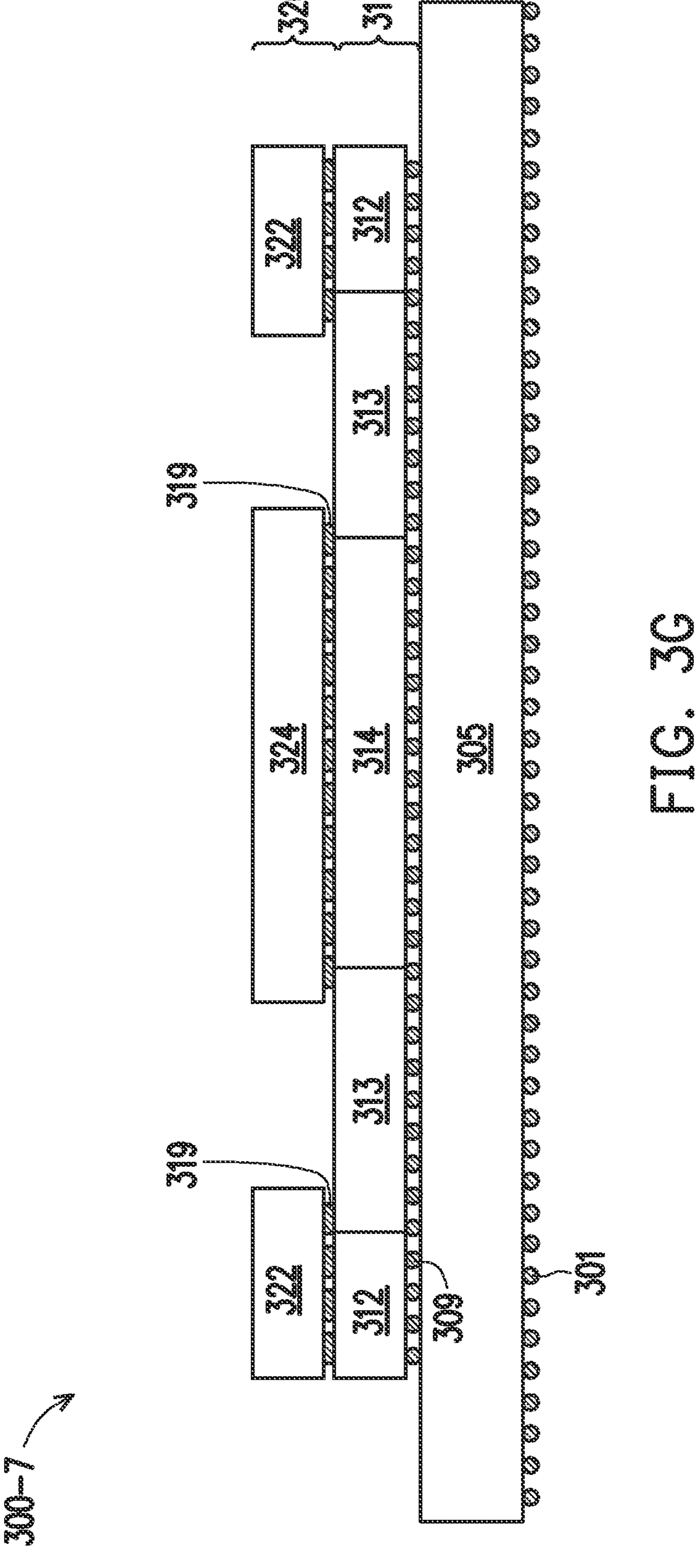

FIG. 3G is a cross-sectional view of the package 300-7, where the bonded stack or bonded die is attached to a package substrate 305, at one of the various stages of fabrication, according to some embodiments of the present disclosure. This may be performed by attaching the first layer 310 onto the package substrate 305 with bumps 309, e.g. using a flip-chip (C4) interconnection method with copper bumps. In one embodiment, the package substrate 305 may be formed of silicon oxide or another oxide material. According to various embodiments, the package substrate 305 may be coupled to a PCB board (not shown) with package bumps 301.

Figure 3H:
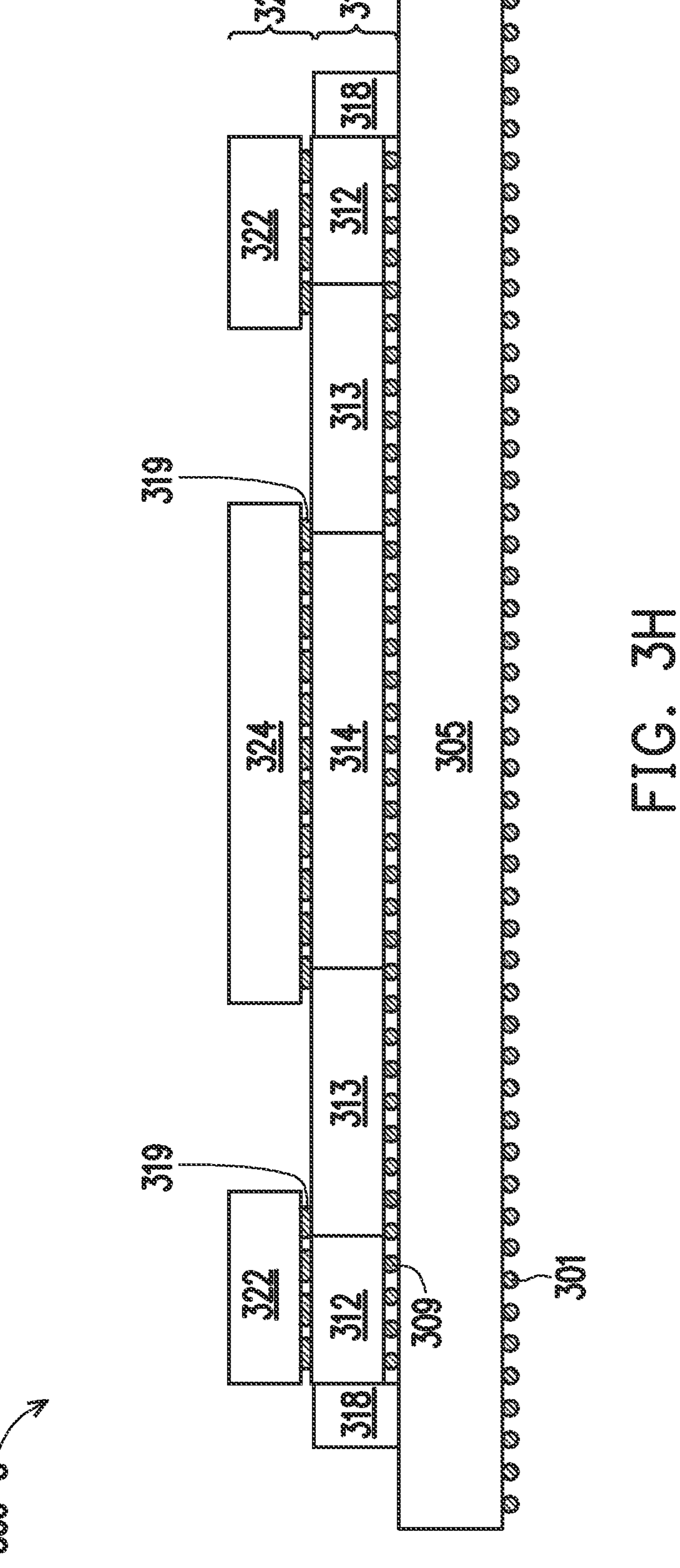

FIG. 3H is a cross-sectional view of the package 300-8, where a pedestal 318 is deposited on the package substrate 305 and adjacent to each electronic die 312 in the first layer 310, at one of the various stages of fabrication, according to some embodiments of the present disclosure. This may be performed by epitaxially growing a semiconductor material or a polymer material with a patterned photomask to form the pedestals 318.

Figure 3I:
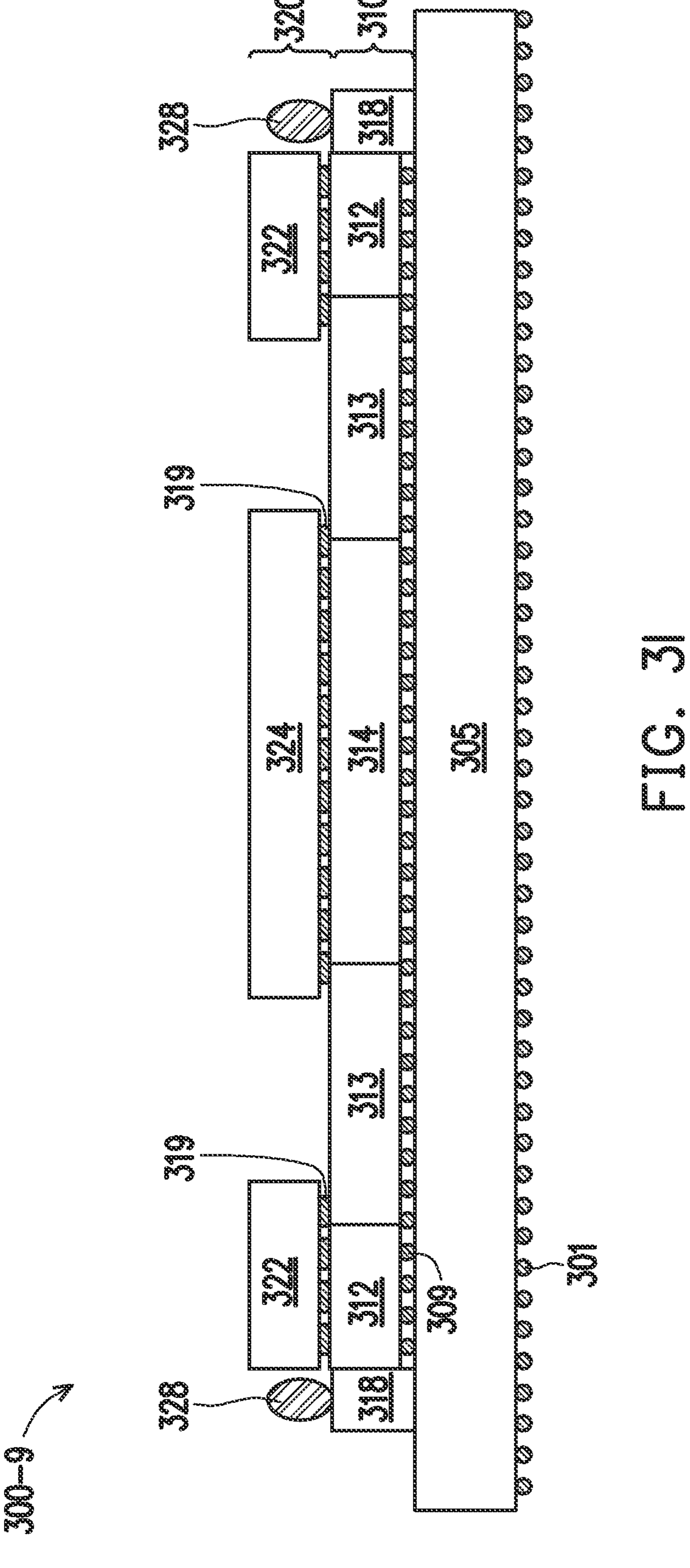

FIG. 3I is a cross-sectional view of the package 300-9, where a lens 328 is formed onto each pedestal 318 and aligned to a corresponding photonic die 322 in the second layer 320, at one of the various stages of fabrication, according to some embodiments of the present disclosure. This may be performed by depositing one or more polymer material on each pedestal 318, to form a polymer lens 328 attached to the corresponding photonic die 322. The polymer lens 328 is aligned to the corresponding photonic die 322 at a same height, which means a light may be guided through the polymer lens 328 and into a waveguide in the photonic die 322, and from the waveguide into and through the polymer lens 328.

Figure 3J:
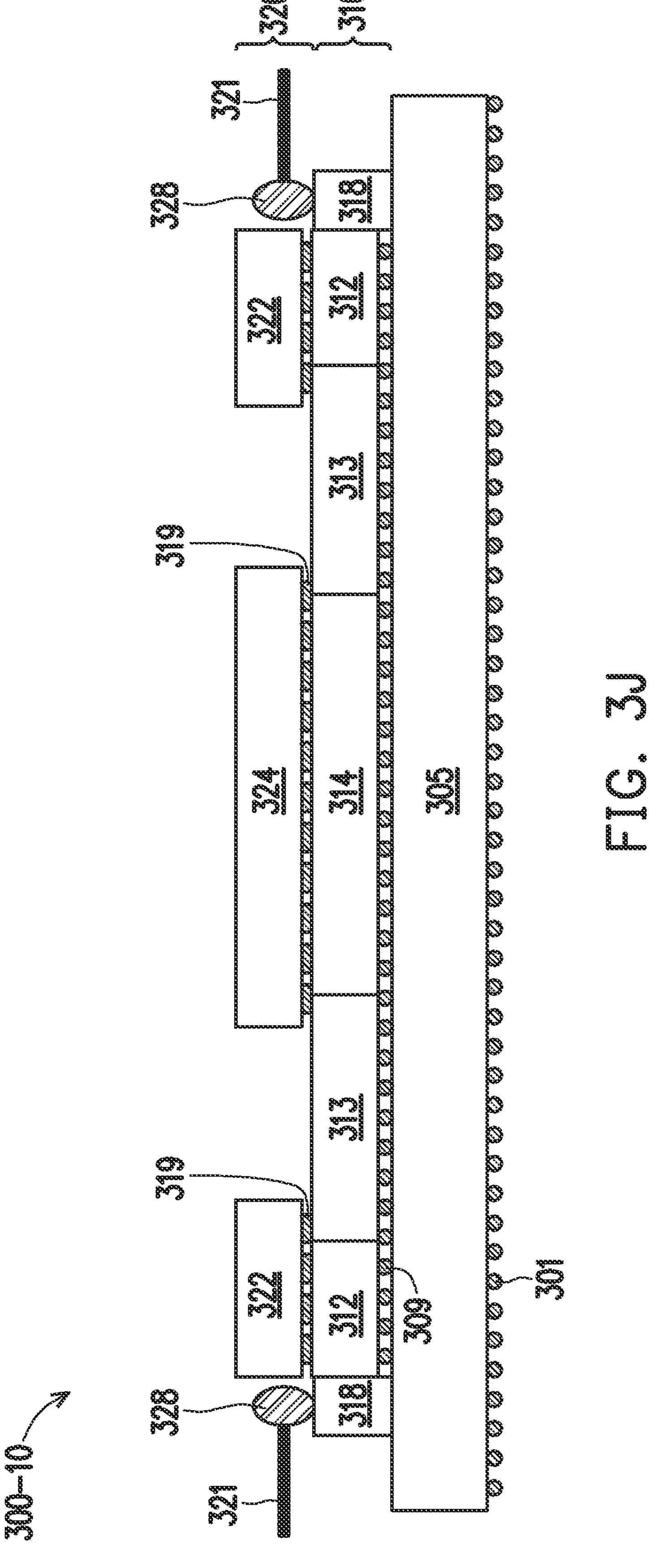

FIG. 3J is a cross-sectional view of the package 300-10, where an optical fiber 321 is attached to each polymer lens 328 in the second layer 320, at one of the various stages of fabrication, according to some embodiments of the present disclosure. This may be performed by attaching an optical fiber 321 to each polymer lens 328 with an aligned height such that a light can be guided in or out of the corresponding photonic die 322 via the lens 328 and the optical fiber 321. The polymer lens 328 is disposed at a position to couple the light transmission between the optical fiber 321 and the corresponding photonic die 322.

Figure 3K:
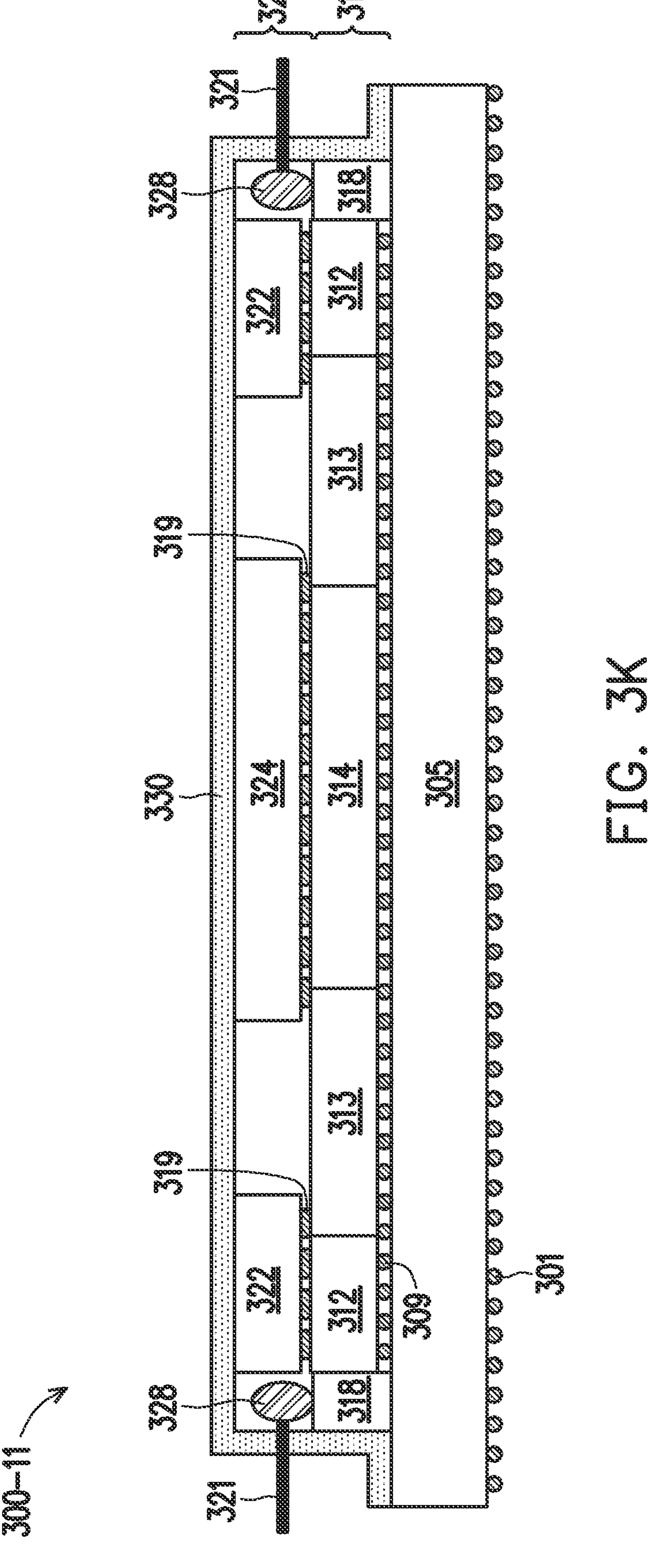

FIG. 3K is a cross-sectional view of the package 300-11, where a heat spreader 330 is deposited onto the second layer 320 and maybe partially the package substrate 305, at one of the various stages of fabrication, according to some embodiments of the present disclosure. This may be performed by depositing a heat conductive material, e.g. copper, silver or aluminum, on and in contact with the second layer 320.

Figure 3L:
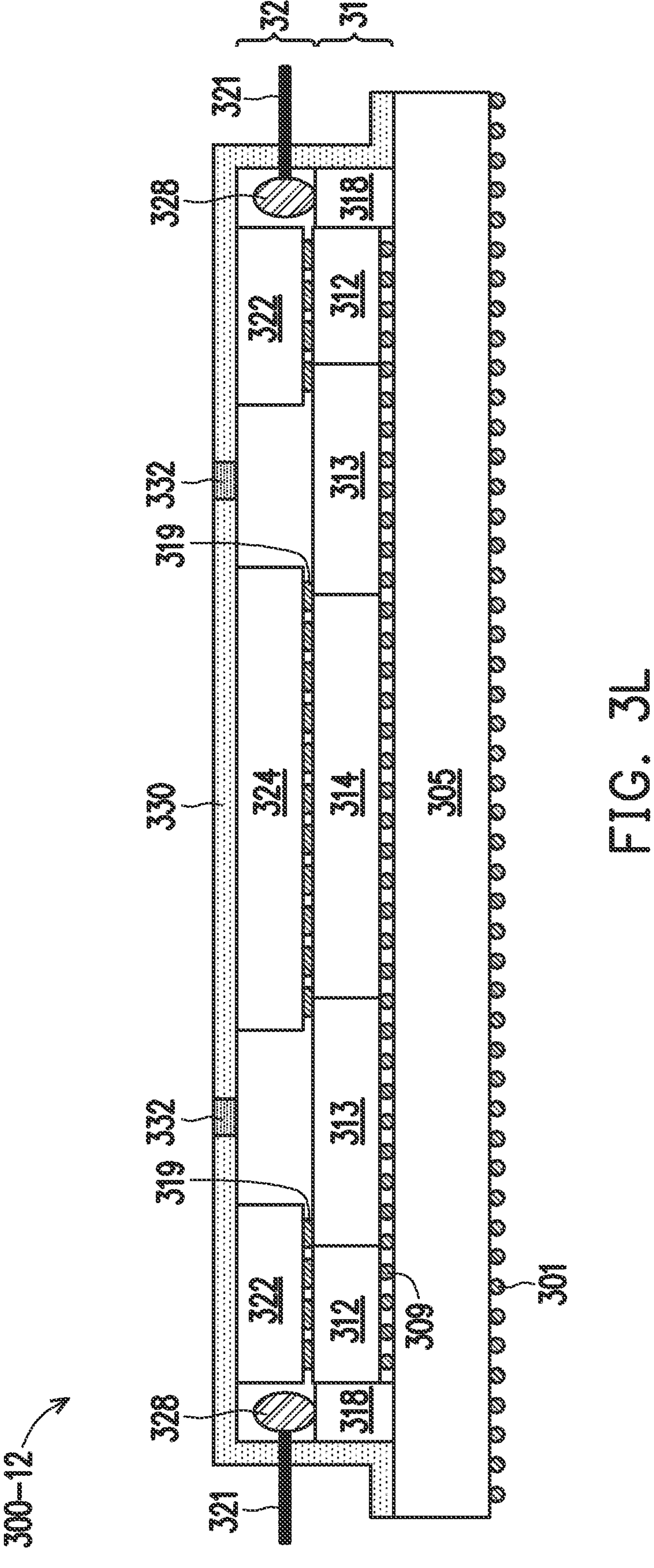

FIG. 3L is a cross-sectional view of the package 300-12, where one or more thermal breaks 332 are formed in the heat spreader 330, at one of the various stages of fabrication, according to some embodiments of the present disclosure. This may be performed by: defining a geometric pattern from a photomask to the heat spreader 330 based on photolithography; etching the heat spreader 330 to determine an etched region in the heat spreader 330; depositing a heat isolation material in the etched region to form the thermal breaks 332; and performing chemical mechanical polishing (CMP) to smooth the surfaces of the thermal breaks 332 and the heat spreader 330. As shown in FIG. 3L, at least one thermal break 332 is formed between the top die 324 and adjacent photonic die 322, to avoid or reduce heat transfer between the top die 324 and adjacent photonic die 322.

Figure 4:
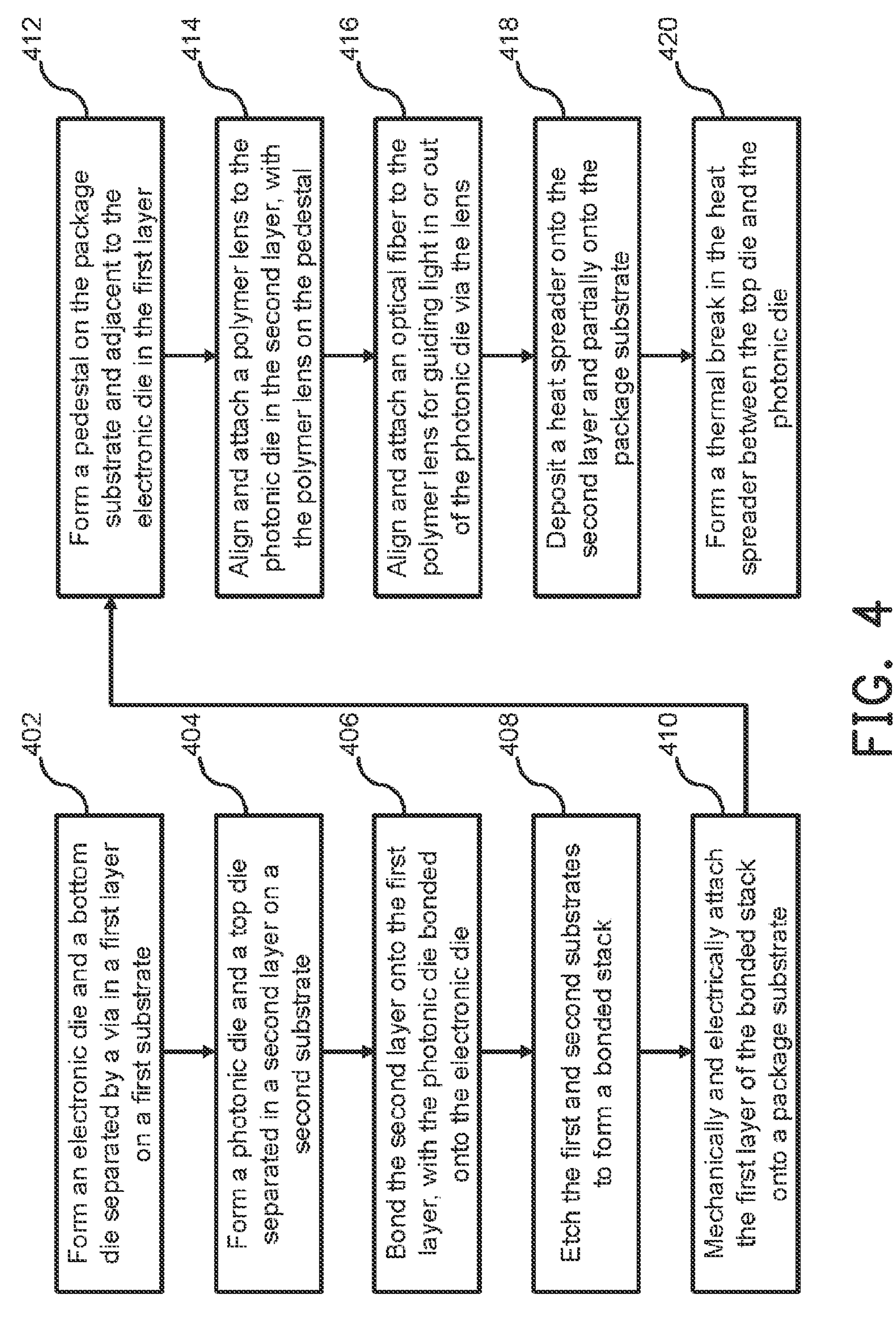
FIG. 4 illustrates an exemplary method for package integration of photonic and electronic elements, in accordance with some embodiments of the present disclosure.

FIG. 4 illustrates an exemplary method 400 for package integration of photonic and electronic elements, in accordance with some embodiments of the present disclosure. The method begins at operation 402, where an electronic die and a bottom die are formed and separated by a via in a first layer on a first substrate. At operation 404, a photonic die and a top die are formed and separated in a second layer on a second substrate. At operation 406, the second layer is bonded onto the first layer, where the photonic die is bonded onto the electronic die. The first and second substrates are etched at operation 408 to form a bonded stack. At operation 410, the first layer of the bonded stack is mechanically and electrically attached onto a package substrate.

At operation 412, a pedestal is formed on the package substrate and adjacent to the electronic die in the first layer. At operation 414, a polymer lens is aligned and attached to the photonic die in the second layer, where the polymer lens is formed on the pedestal. At operation 416, an optical fiber is aligned and attached to the polymer lens for guiding light in or out of the photonic die via the lens. As such, the polymer lens can couple the light transmission between the optical fiber and the photonic die. A heat spreader is deposited at operation 418 onto the second layer and partially onto the package substrate. At operation 420, a thermal break is formed in the heat spreader between the top die and the photonic die. The order of the operations shown in FIG. 4 maybe changed according to different embodiments of the present disclosure.

Figure 5A:
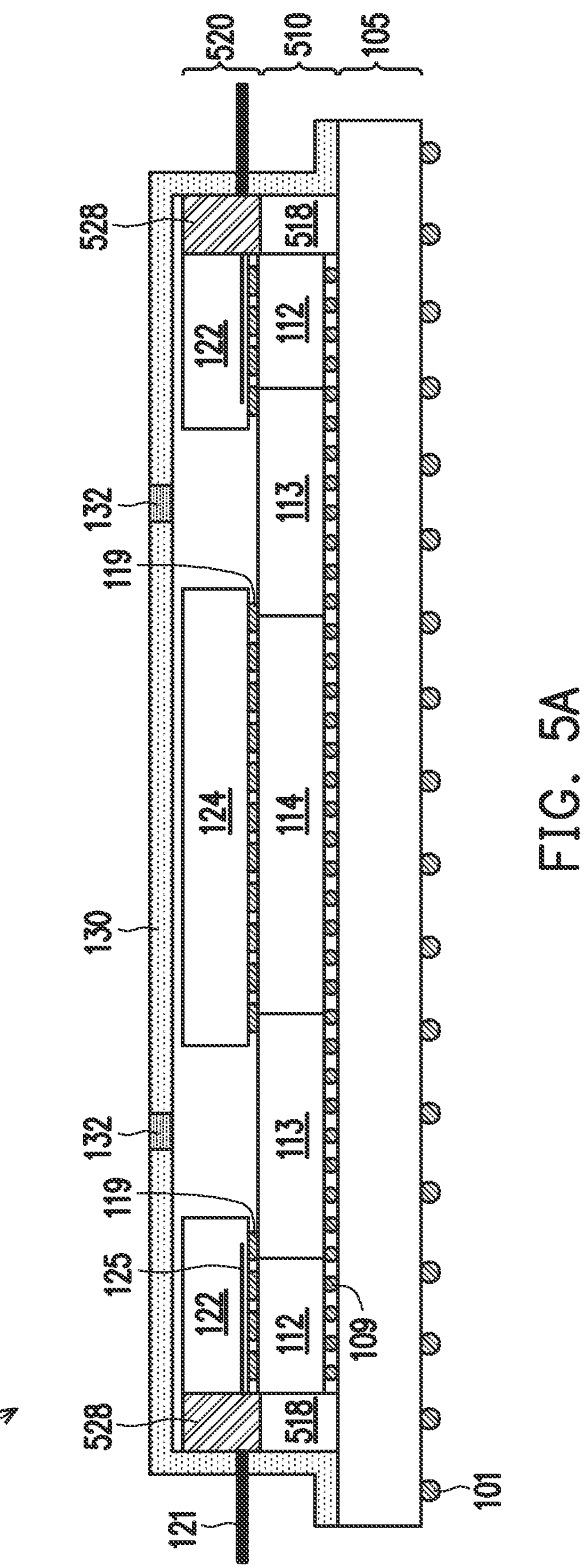
FIG. 5A illustrates a cross-sectional view of another exemplary integrated circuit (IC) package, in accordance with some embodiments of present disclosure.

FIG. 5A illustrates a cross-sectional view of another exemplary integrated circuit (IC) package 500, in accordance with some embodiments of present disclosure. It is noted that the package 500 is merely an example, and is not intended to limit the present disclosure. Accordingly, it is understood that additional functional blocks may be provided in or coupled to the package 500 of FIG. 5A, and that some other functional blocks may only be briefly described herein.

The package 500 in FIG. 5A has a similar structure to that of the package 100 in FIG. 1A, except that the package 500 includes a polymer waveguide 528, instead of a polymer lens, to be aligned and attached to the photonic die 122 in the second layer 520.

As shown in FIG. 5A, the package 500 comprises a mold 518 adjacent to each electronic die 112 in the first layer 510. The mold 518 is formed on the package substrate 105 and serves as a support for the polymer waveguide 528. In one embodiment, the mold 518 has a height between 50 and 100 micrometers. The polymer waveguide 528 is deposited onto each mold 518. Each polymer waveguide 528 is aligned to a corresponding photonic die 122 in the second layer 520, and configured to guide light in or out of the photonic die 122. In one embodiment, the polymer waveguide 528 is aligned to a silicon waveguide in the photonic die 122 in the second layer 520 and configured to guide light in or out of the silicon waveguide in the photonic die 122. The polymer waveguide may be wider than the silicon waveguide along a direction of propagation of the light. In one embodiment, each polymer waveguide 528 has a width between 2 and 10 micrometers. In one embodiment, each polymer waveguide 528 has a height between 2 and 10 micrometers.

As shown in FIG. 5A, the package 500 further comprises an optical fiber 121 aligned and attached to each polymer waveguide 528, to guide the light in or out of the polymer waveguide 528 through an edge coupler or a grating coupler which may be located within the polymer waveguide 528. In one embodiment, an edge coupler or grating coupler is located between the optical fiber 121 and the polymer waveguide 528. In another embodiment, an edge coupler or grating coupler is located between the polymer waveguide 528 and the photonic die 122. In another embodiment, one edge coupler or grating coupler is located between the optical fiber 121 and the polymer waveguide 528; and another edge coupler or grating coupler is located between the polymer waveguide 528 and the photonic die 122. The other components in the package 500 in FIG. 5A are similar to those in the package 100 in FIG. 1A.

Figure 5B:
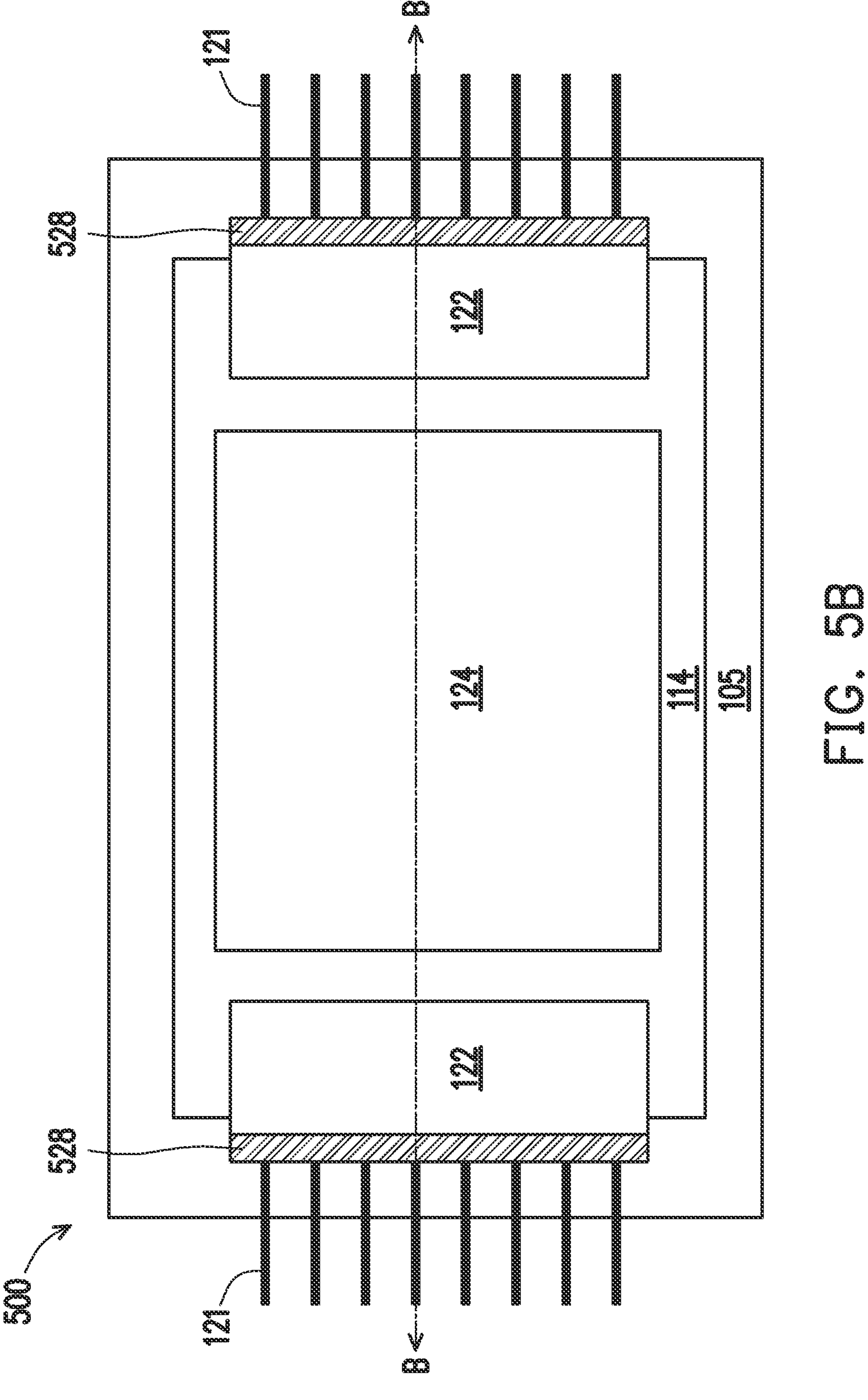
FIG. 5B illustrates a top view of another exemplary IC package, in accordance with some embodiments of the present disclosure.

FIG. 5B illustrates a top view of another exemplary IC package 500, in accordance with some embodiments of the present disclosure. The cross-sectional view of the package 500 in FIG. 5A is taken along the B-B' direction as shown in FIG. 5B. The package 500 in FIG. 5B has a similar structure to that of the package 500 in FIG. 1B, except that the package 500 includes a one-piece polymer waveguide 528, instead of a lens arrays, to be aligned and attached to each photonic die 122.

As shown in FIG. 5B, the package 500 comprises a plurality of polymer waveguides 528 each of which is aligned to a corresponding photonic die 122. In one embodiment, each polymer waveguide 528 is aligned to a silicon waveguide (not shown) in a corresponding photonic die 122 in the second layer.

The package 500 comprises a plurality of fiber arrays each of which comprises multiple optical fibers 121 and is aligned and attached to a corresponding polymer waveguide 528. Each optical fiber 121 may be a single-mode or a multi-mode optical fiber. Each polymer waveguide 528 is configured to guide light transmission between the corresponding photonic die 122 and the corresponding fiber array, or between the silicon waveguide in the corresponding photonic die 122 and the corresponding fiber array. The other components in the package 500 in FIG. 5B are similar to those in the package 100 in FIG. 1B.

FIGS. 6A-6L illustrate cross-sectional views of an exemplary IC package at various stages of a fabrication process, in accordance with some embodiments of the present disclosure. The stages shown in FIGS. 6A-6G are the same as the stages shown in FIGS. 3A-3G, and are referred to the descriptions above regarding FIGS. 3A-3G.

Figures 6A, 6B:
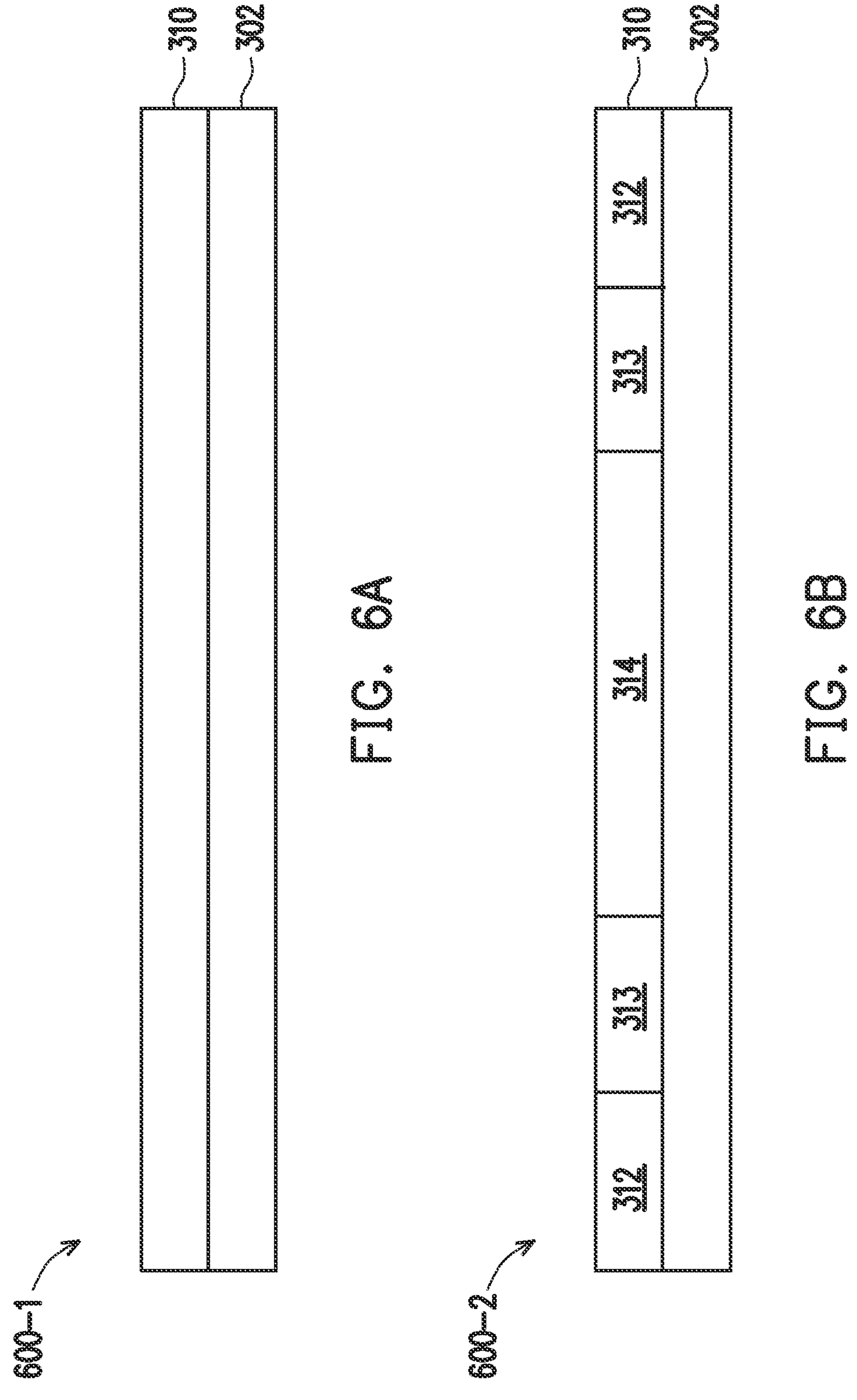
FIGS. 6A-6L illustrate cross-sectional views of another exemplary IC package at various stages of a fabrication process, in accordance with some embodiments of the present disclosure.
Figures 6C, 6D:
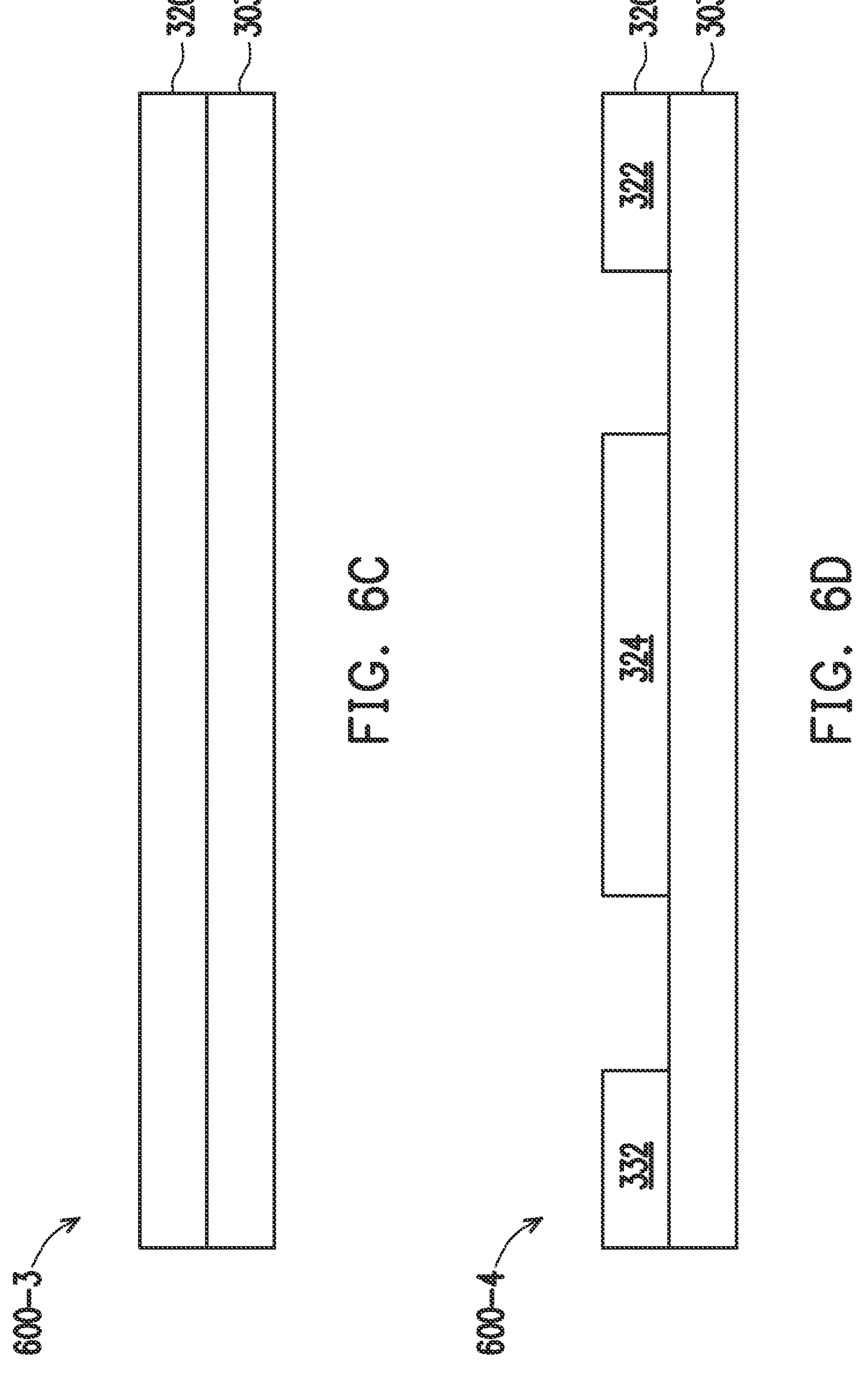
Figure 6E:
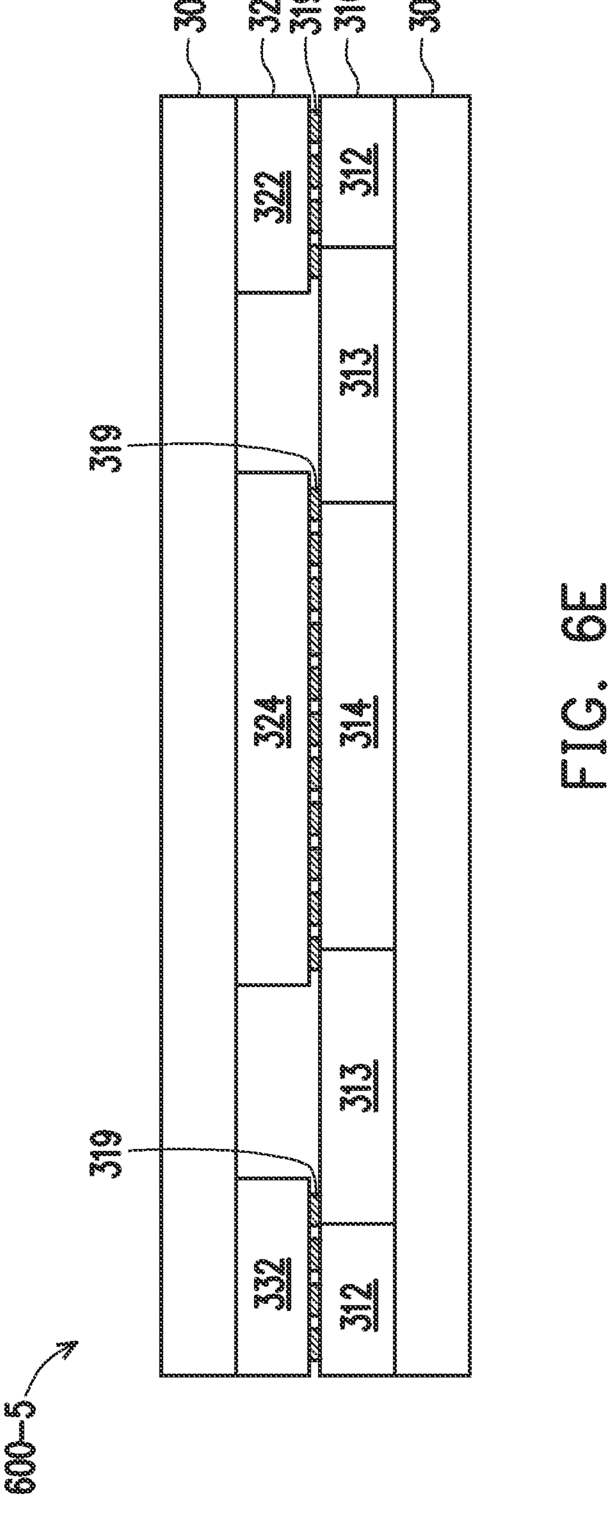
Figure 6F:
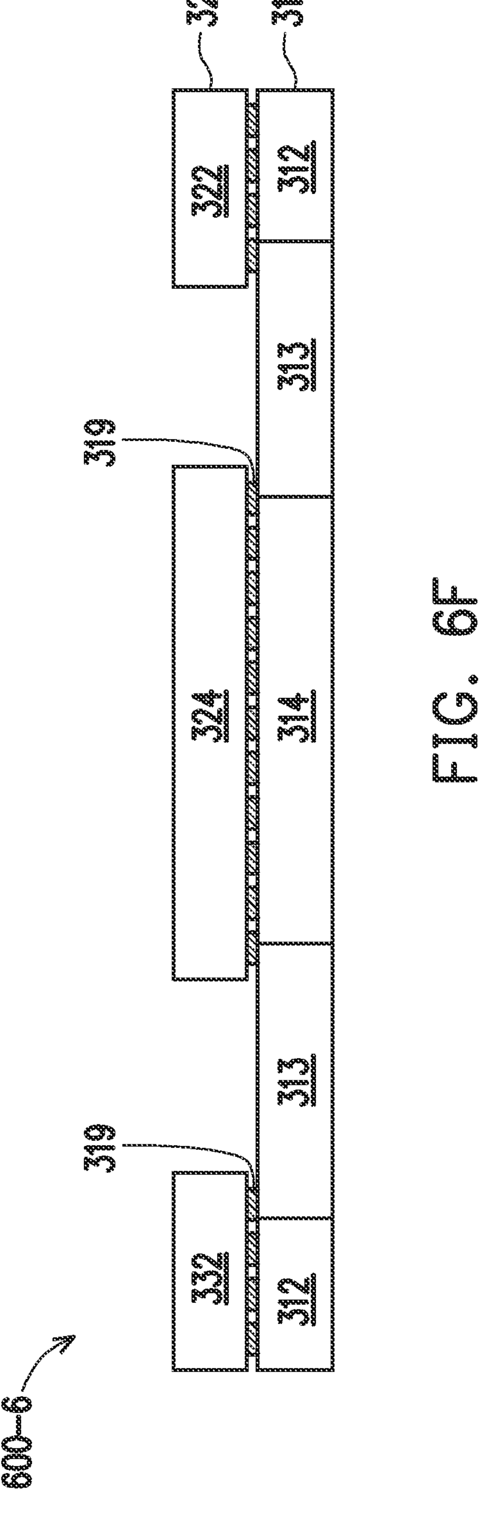
Figure 6G:
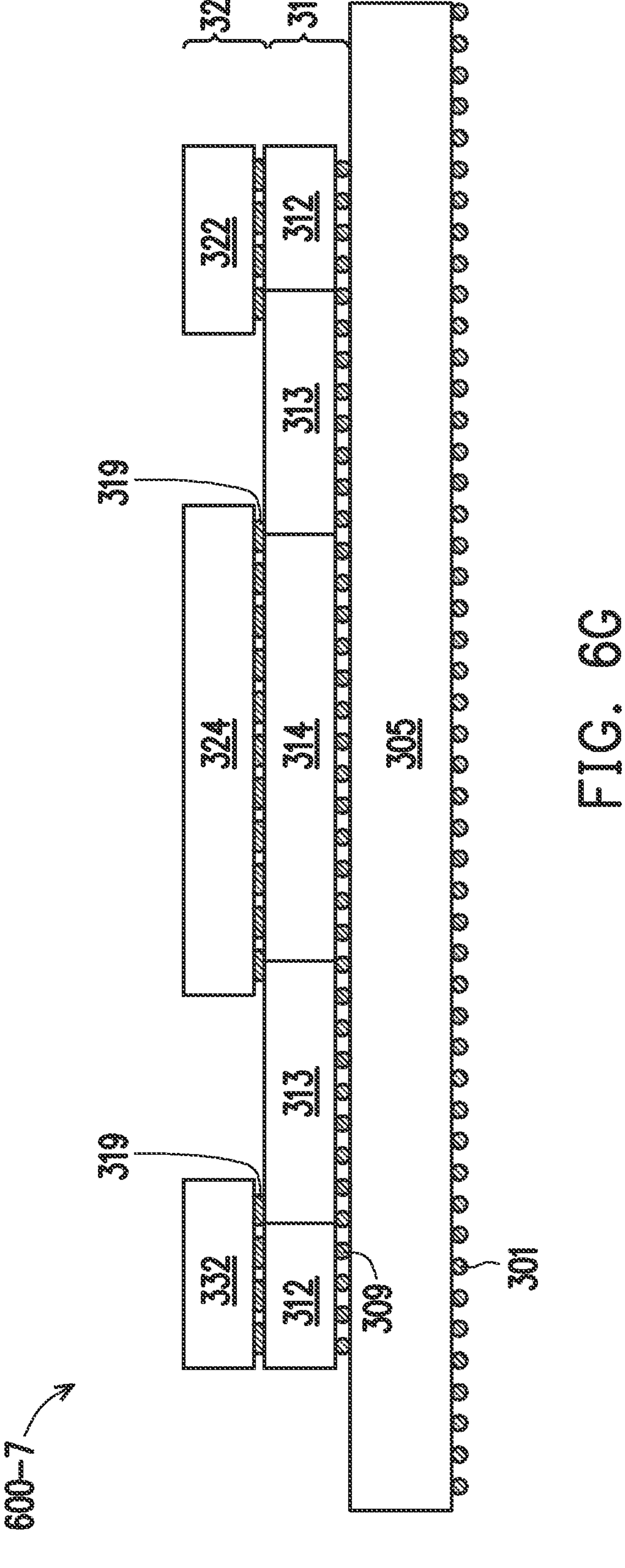
Figure 6H:
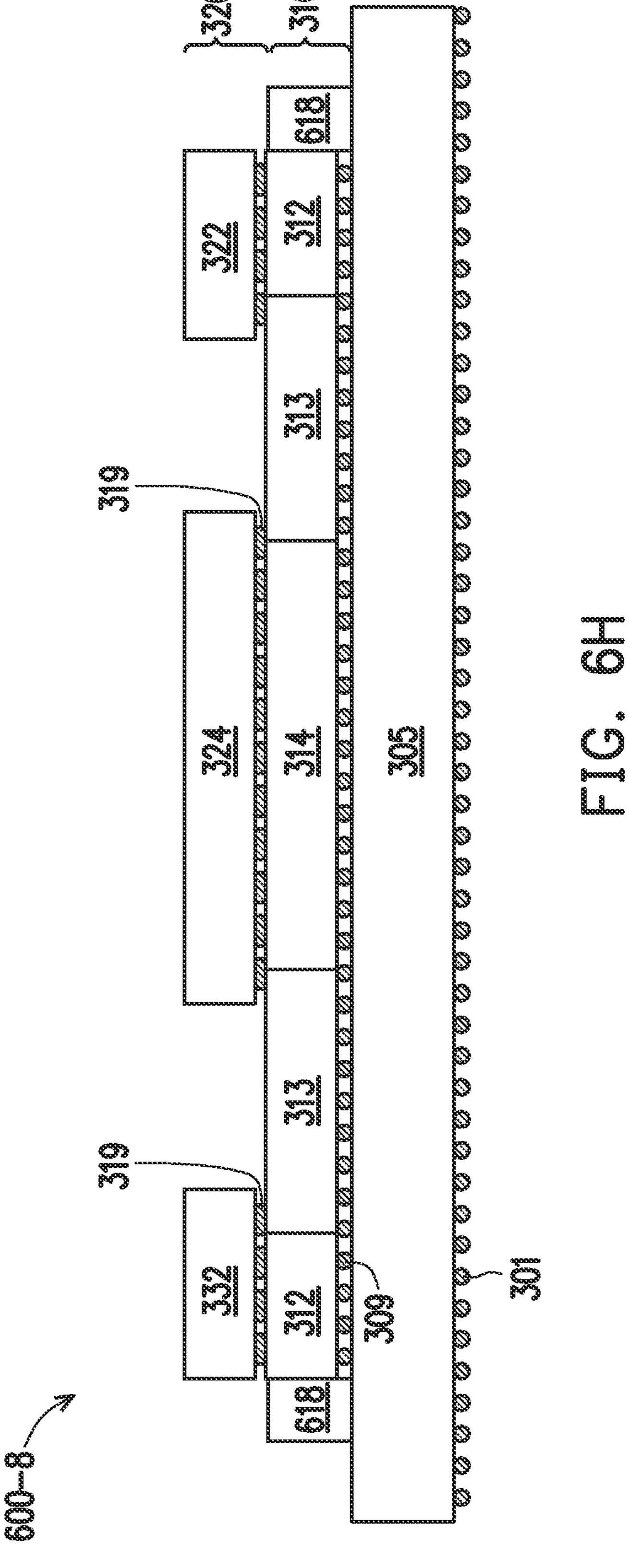

FIG. 6H is a cross-sectional view of the package 600-8, where a mold 618 is deposited on the package substrate 305 and adjacent to each electronic die 312 in the first layer 310, at one of the various stages of fabrication, according to some embodiments of the present disclosure. This may be performed by depositing a material, e.g. a silicon oxide or another glass material, with a patterned photomask to form the molds 618.

Figure 6I:
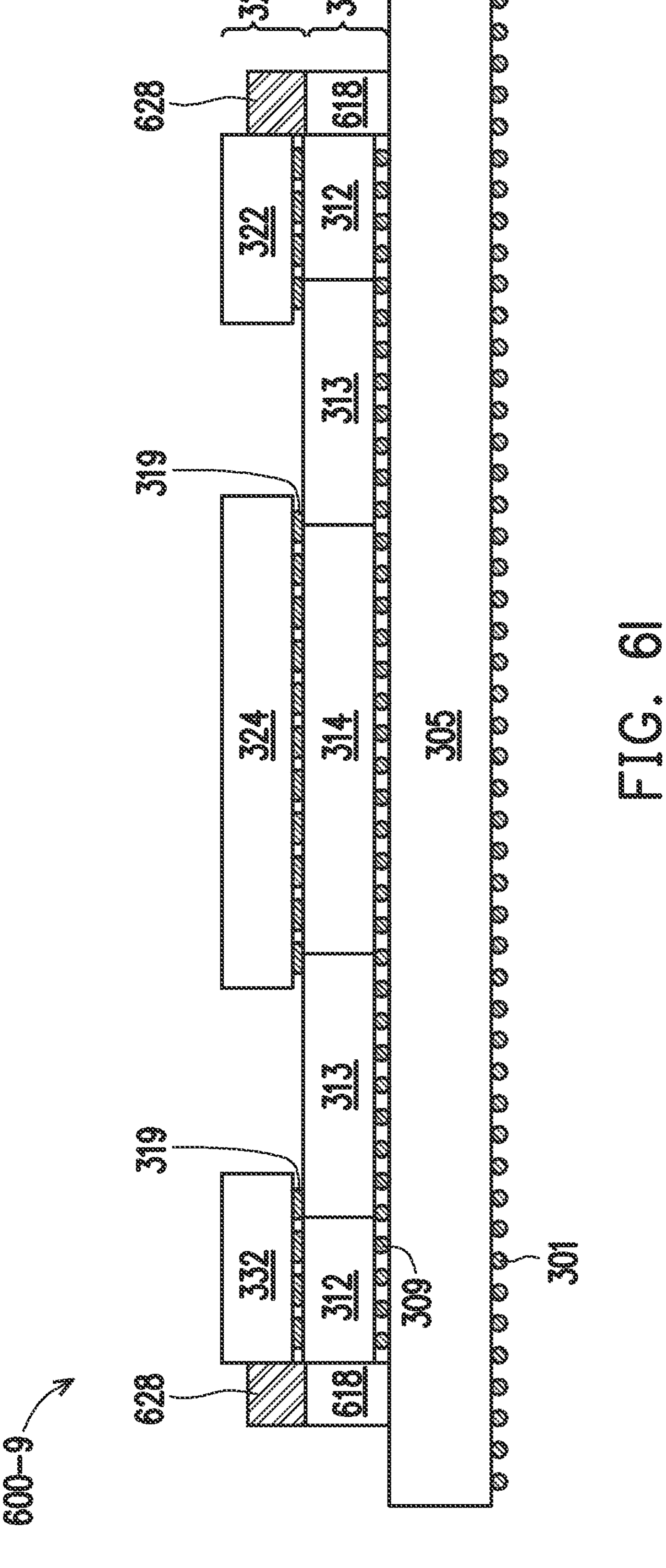

FIG. 6I is a cross-sectional view of the package 600-9, where a polymer waveguide 628 is formed onto each mold 618 and aligned to a corresponding photonic die 322 in the second layer 320, at one of the various stages of fabrication, according to some embodiments of the present disclosure. This may be performed by depositing one or more polymer material (e.g. a silicon polymer) on each mold 618, to form a polymer waveguide 628 attached to the corresponding photonic die 322. The polymer waveguide 628 may be aligned to the corresponding photonic die 322 at a same height, which means a light may be guided through the polymer waveguide 628 and into a silicon waveguide in the photonic die 322, and/or from the silicon waveguide into and through the polymer waveguide 628.

Figure 6J:
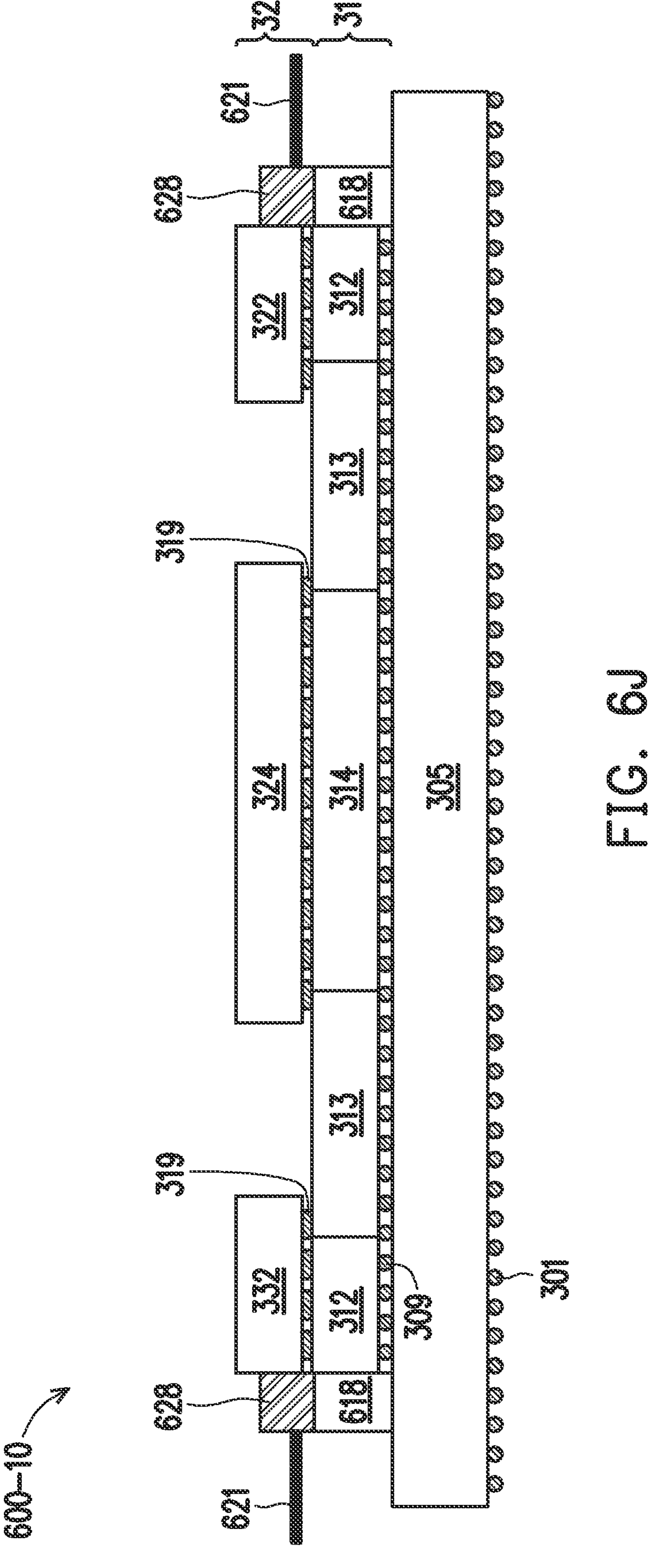

FIG. 6J is a cross-sectional view of the package 600-10, where a fiber array 621 is attached to each polymer waveguide 628 in the second layer 320, at one of the various stages of fabrication, according to some embodiments of the present disclosure. This may be performed by attaching a fiber array 621 to each polymer waveguide 628 with an aligned height such that lights can be guided in or out of the corresponding photonic die 322 via the polymer waveguide 628 and the fiber array 621. The polymer waveguide 628 is disposed at a position to couple the light transmission between the fiber array 621 and the corresponding photonic die 322.

Figure 6K:
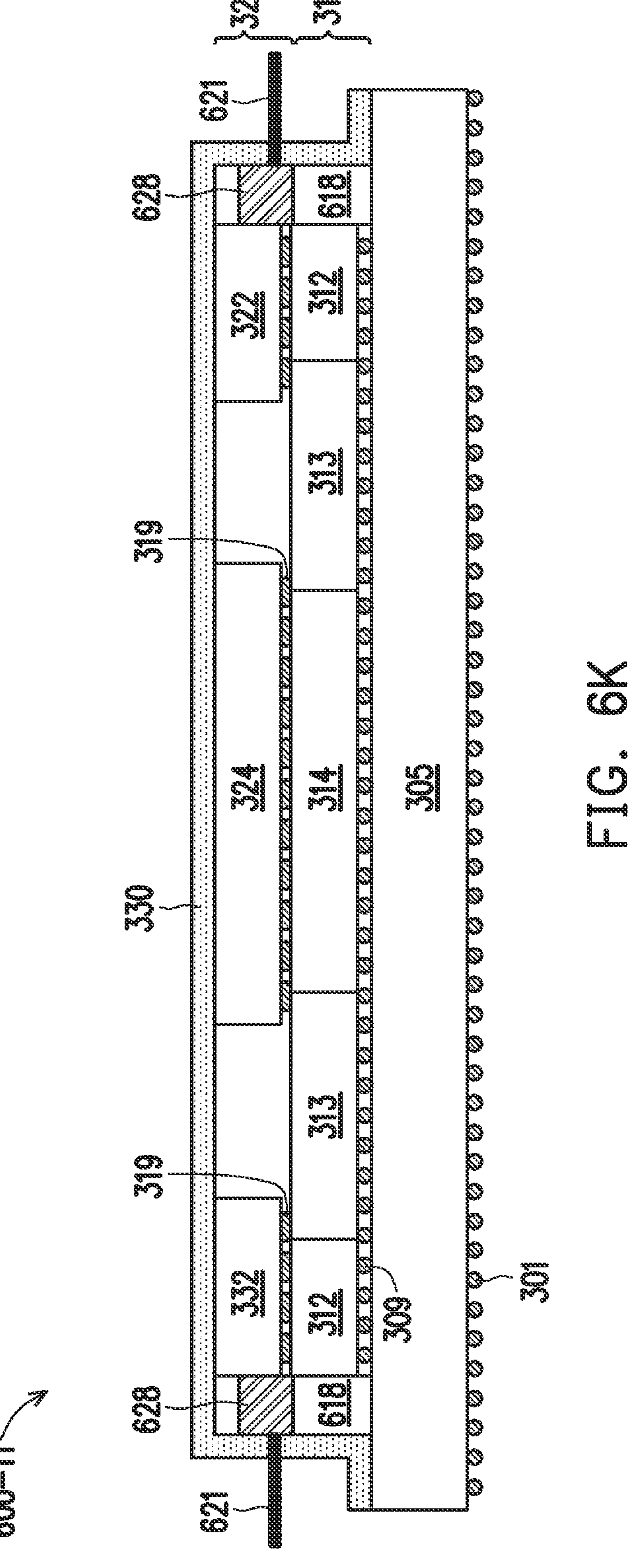

Similar to the stage shown in FIG. 3K, FIG. 6K is a cross-sectional view of the package 600-11, where a heat spreader 330 is deposited onto the second layer 320 and maybe partially the package substrate 305, at one of the various stages of fabrication, according to some embodiments of the present disclosure. This may be performed by depositing a heat conductive material, e.g. copper, silver or aluminum, on and in contact with the second layer 320.

Figure 6L:
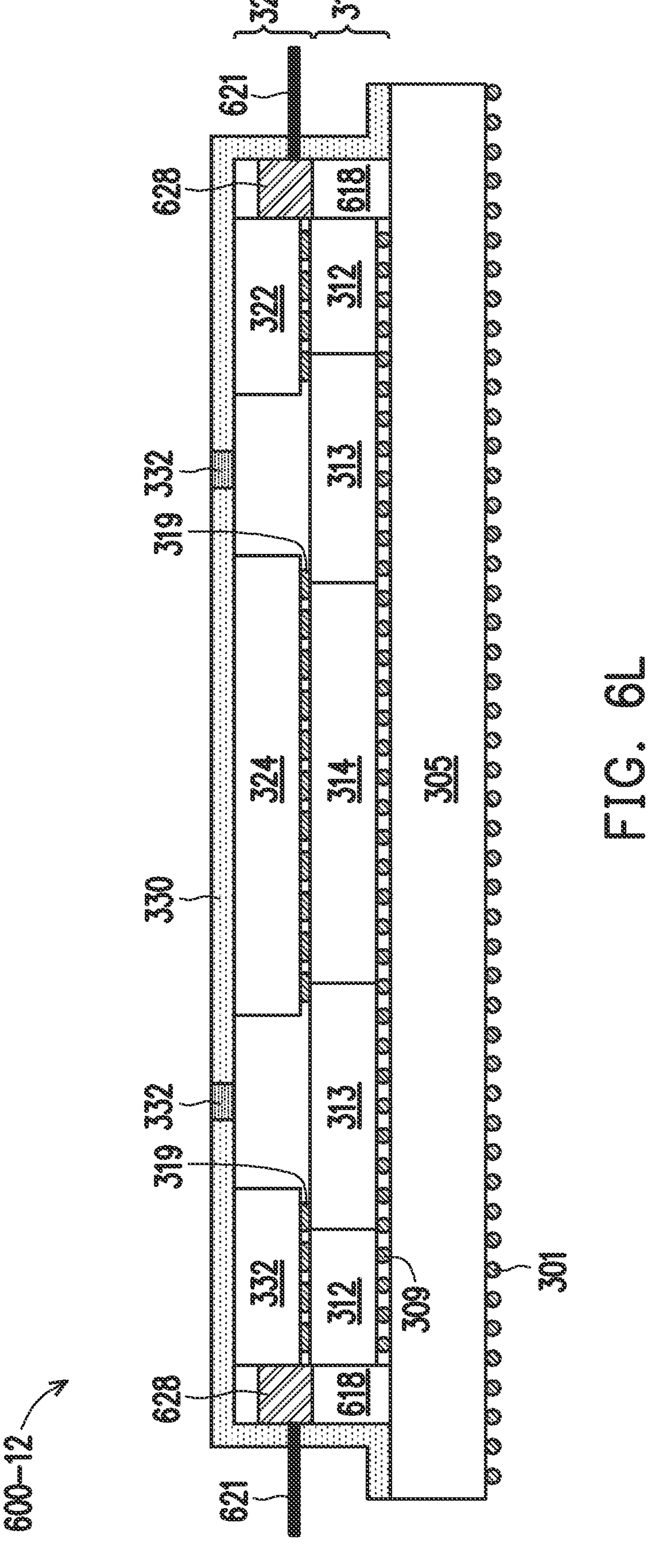

Similar to the stage shown in FIG. 3L, FIG. 6L is a cross-sectional view of the package 600-12, where one or more thermal breaks 332 are formed in the heat spreader 330, according to some embodiments of the present disclosure. As shown in FIG. 6L, at least one thermal break 332 is formed between the top die 324 and adjacent photonic die 322, to avoid or reduce heat transfer between the top die 324 and adjacent photonic die 322.

Figure 7:
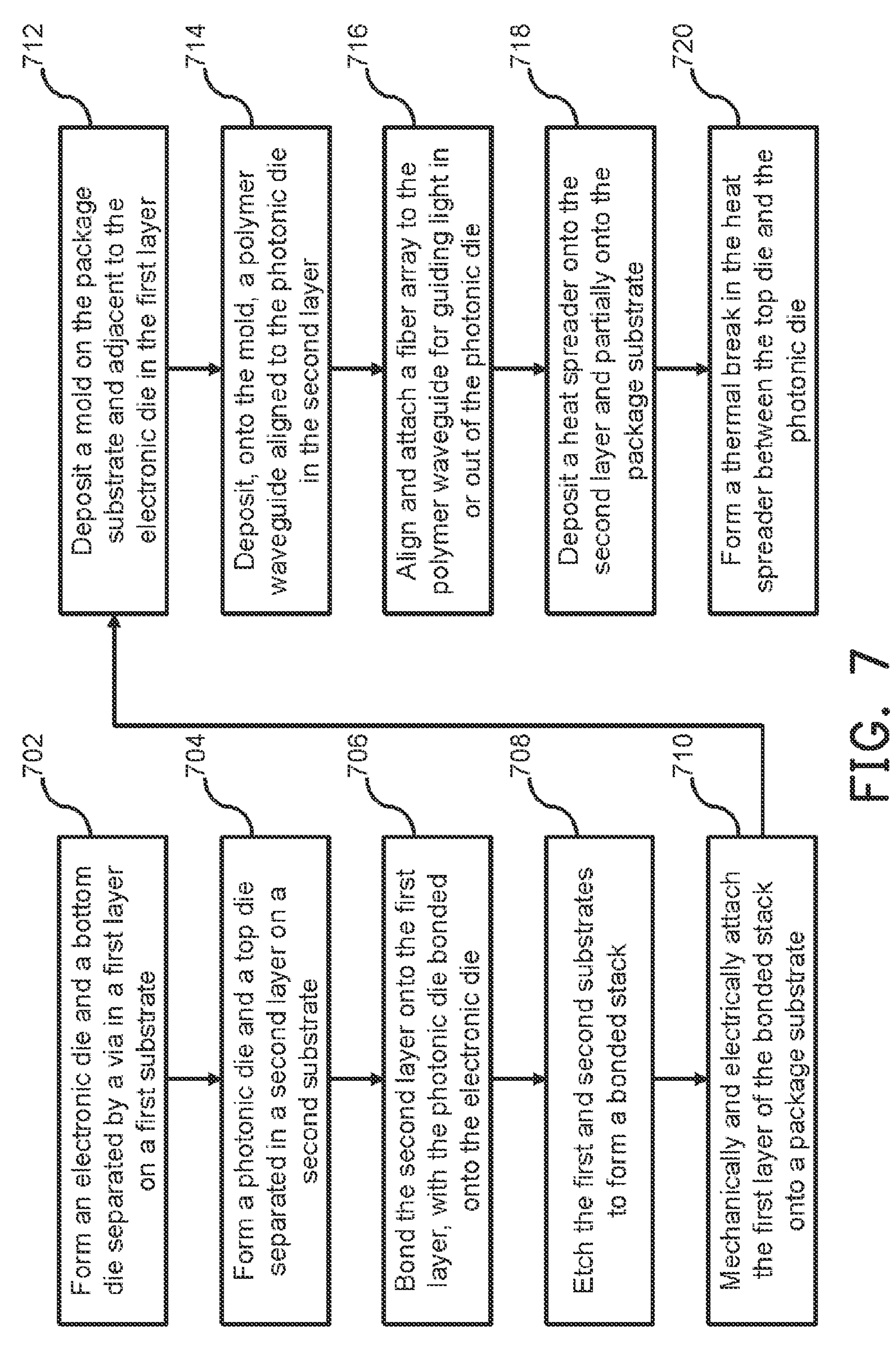
FIG. 7 illustrates another exemplary method for package integration of photonic and electronic elements, in accordance with some embodiments of the present disclosure.

FIG. 7 illustrates another exemplary method 700 for package integration of photonic and electronic elements, in accordance with some embodiments of the present disclosure. The method begins at operation 702, where an electronic die and a bottom die are formed and separated by a via in a first layer on a first substrate. At operation 704, a photonic die and a top die are formed and separated in a second layer on a second substrate. At operation 706, the second layer is bonded onto the first layer, where the photonic die is bonded onto the electronic die. The first and second substrates are etched at operation 708 to form a bonded stack. At operation 710, the first layer of the bonded stack is mechanically and electrically attached onto a package substrate.

At operation 712, a mold is deposited on the package substrate and adjacent to the electronic die in the first layer. At operation 714, a polymer waveguide is deposited onto the mold and aligned to the photonic die in the second layer. At operation 716, a fiber array is aligned and attached to the polymer waveguide for guiding light in or out of the photonic die via the polymer waveguide. As such, the polymer waveguide can couple the light transmission between the fiber array and the photonic die. A heat spreader is deposited at operation 718 onto the second layer and partially onto the package substrate. At operation 720, a thermal break is formed in the heat spreader between the top die and the photonic die. The order of the operations shown in FIG. 7 maybe changed according to different embodiments of the present disclosure.

In one embodiment, a package is disclosed. The package includes: a package substrate; a first layer comprising an electronic die on the package substrate; and a second layer comprising a photonic die, wherein the second layer is bonded onto the first layer such that the photonic die is bonded onto the electronic die.

In another embodiment, a device is disclosed. The device includes: a substrate; a first layer comprising a plurality of electronic dies on the substrate; and a second layer comprising a plurality of photonic dies on the first layer, wherein each of the plurality of photonic dies is on and in contact with a corresponding one of the plurality of electronic dies.

In yet another embodiment, a method for forming a semiconductor device is disclosed. The system includes: forming a first layer comprising an electronic die; forming a second layer comprising a photonic die, wherein the electronic die comprises at least one driver for the photonic die; bonding the second layer onto the first layer to generate a bonded stack, wherein the photonic die is bonded onto the electronic die; and mechanically and electrically attaching the bonded stack onto a package substrate using conductive bumps, wherein the first layer is attached to the package substrate with the conductive bumps.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:

forming a first layer comprising an electronic die and a bottom die;

forming a second layer comprising a photonic die and a top die, wherein the electronic die comprises at least one driver for the photonic die;

bonding the second layer onto the first layer to generate a bonded stack, wherein the photonic die is bonded onto the electronic die with hybrid bonds, which comprise dielectric-to-dielectric bonds and metal-to-metal bonds; and mechanically and electrically attaching the bonded stack onto a package substrate using conductive bumps, wherein the first layer is attached to the package substrate with the conductive bumps.

2. The method of claim 1, wherein the bottom die comprises analog and chipset functions, and forming the first layer comprises:

depositing silicon in the first layer on a first substrate;

determining a geometric pattern from a photomask based on photolithography;

etching the silicon to determine etched regions based on the geometric pattern; and epitaxially growing one or more semiconductor materials in the etched regions to form:

the electronic die, the bottom die, and a via between the bottom die and the electronic die in the first layer, wherein the via provides electrical connectivity between the second layer and the package substrate after bonding the second layer onto the first layer.

3. The method of claim 1, wherein the top die comprises computing elements, and forming the second layer comprises:

depositing silicon in the second layer on a second substrate;

defining a geometric pattern from a photomask based on photolithography;

etching the silicon to determine etched regions based on the geometric pattern; and epitaxially growing one or more semiconductor materials in the etched regions to form the photonic die and the top die, wherein the photonic die is bonded to the electronic die with the hybrid bonds in a face-to-face configuration.

4. The method of claim 3, further comprising:

depositing a heat spreader on the second layer; and forming a thermal break in the heat spreader between the top die and the photonic die.

5. The method of claim 1, further comprising:

forming a pedestal on the package substrate and adjacent to the electronic die in the first layer;

attaching a polymer lens to the photonic die in the second layer, wherein the polymer lens is positioned on the pedestal; and attaching an optical fiber to the polymer lens, such that the polymer lens couples light transmission between the optical fiber and the photonic die.

6. The method of claim 1, further comprising:

depositing a mold on the package substrate and adjacent to the electronic die in the first layer;

depositing a polymer waveguide on the mold, wherein the polymer waveguide is attached to the photonic die in the second layer; and attaching a fiber array to the polymer waveguide, such that the polymer waveguide couples light transmission between the fiber array and the photonic die, wherein the top die comprises a first component configured to operate at a first operation frequency, and the bottom die comprises a second component configured to operate at a second operation frequency that is lower than the first operation frequency.

7. A method for forming a semiconductor device, comprising:

forming a first layer, comprising an electronic die and a bottom die, over a substrate; and forming a second layer on the first layer, wherein the second layer comprises a photonic die and a top die, wherein the top die comprises a first component configured to operate at a first operation frequency, and the bottom die comprises a second component configured to operate at a second operation frequency that is lower than the first operation frequency.

8. The method of claim 7, further comprising:

bonding the photonic die to the electronic die with hybrid bonds.

9. The method of claim 8, wherein bonding the photonic die to the electronic die with hybrid bonds further comprises:

bonding the photonic die to the electronic die in a face-to-face configuration.

10. The method of claim 7, wherein:

the electronic die comprises a driver for the photonic die.

11. The method of claim 7, wherein the bottom die is separated from the electronic die by a via that provides electrical connectivity between the second layer and a package substrate.

12. The method of claim 11, wherein:

the top die is bonded onto the bottom die; and the top die is separated from the photonic die in the second layer.

13. The method of claim 12, wherein:

the bottom die comprises a first plurality of components;

the top die comprises a second plurality of components; and compared to a first component of the first plurality of components in the bottom die, a second component of the second plurality of components in the top die has at least one of: a higher operation frequency, a higher clock frequency, a greater circuit area scaling capability, or a higher memory speed.

14. A method for forming a semiconductor device, comprising:

forming a first layer by performing operations comprising:

determining a first geometric pattern from a first photomask based on photolithography;

etching a first silicon substrate to determine first etched regions based on the first geometric pattern; and epitaxially growing one or more first semiconductor materials in the first etched regions to form an electronic die and a bottom die that comprises analog and chipset functions in the first layer;

forming a second layer by performing operations comprising:

determining a second geometric pattern from a second photomask based on photolithography;

etching a second silicon substrate to determine second etched regions based on the second geometric pattern; and epitaxially growing one or more second semiconductor materials in the second etched regions to form a photonic die and a top die with computing elements; and bonding the second layer onto the first layer in a face-to-face orientation to generate a bonded stack, wherein the photonic die is bonded onto the electronic die with hybrid bonds.

15. The method of claim 14, further comprising:

mechanically and electrically attaching the bonded stack onto a package substrate using conductive bumps, wherein the first layer is attached to the package substrate with the conductive bumps.

16. The method of claim 14, wherein a pitch or vertical distance between the electronic die and the photonic die is less than 10 microns.

17. The method of claim 14, wherein the top die comprises a first component configured to operate at a first operation frequency, and the bottom die comprises a second component configured to operate at a second operation frequency that is lower than the first operation frequency.

18. The method of claim 14, further comprising:

depositing a heat spreader on the second layer; and forming a thermal break in the heat spreader between the top die and the photonic die.

19. The method of claim 15, further comprising:

forming a pedestal on the package substrate adjacent to the electronic die in the first layer;

attaching a polymer lens to the photonic die in the second layer, wherein the polymer lens is positioned on the pedestal; and attaching an optical fiber to the polymer lens, such that the polymer lens couples light transmission between the optical fiber and the photonic die.

20. The method of claim 15, further comprising:

depositing a mold on the package substrate and adjacent to the electronic die in the first layer;

depositing a polymer waveguide on the mold, wherein the polymer waveguide is attached to the photonic die in the second layer; and attaching a fiber array to the polymer waveguide, such that the polymer waveguide couples light transmission between the fiber array and the photonic die.

* * * * *